(12) United States Patent
Preisler et al.

(10) Patent No.: US 11,233,159 B2
(45) Date of Patent: Jan. 25, 2022

(54) FABRICATION OF SEMICONDUCTOR STRUCTURE HAVING GROUP III-V DEVICE ON GROUP IV SUBSTRATE WITH SEPARATELY FORMED CONTACTS USING DIFFERENT METAL LINERS

(71) Applicant: Newport Fab, LLC, Newport Beach, CA (US)

(72) Inventors: Edward Preisler, San Clemente, CA (US); Zhirong Tang, Lake Oswego, OR (US)

(73) Assignee: Newport Fab, LLC, Newport Beach, CA (US)

( * ) Notice: Subject to any disclaimer, the term of this patent is extended or adjusted under 35 U.S.C. 154(b) by 3 days.

(21) Appl. No.: 16/828,868

(22) Filed: Mar. 24, 2020

(65) Prior Publication Data
US 2021/0217904 A1    Jul. 15, 2021

Related U.S. Application Data

(63) Continuation-in-part of application No. 16/792,551, filed on Feb. 17, 2020, and a continuation-in-part of (Continued)

(51) Int. Cl.
*H01L 31/02* (2006.01)
*H01L 31/18* (2006.01)
(Continued)

(52) U.S. Cl.
CPC .. *H01L 31/02005* (2013.01); *H01L 31/03046* (2013.01); *H01L 31/109* (2013.01);
(Continued)

(58) Field of Classification Search
CPC ........... H01L 31/02005; H01L 31/0304; H01L 31/184; H01L 31/109; H01S 5/021; H01S 5/0218
See application file for complete search history.

(56) References Cited

U.S. PATENT DOCUMENTS

| 5,963,828 A | 10/1999 | Allman et al. |
| 6,645,829 B2 * | 11/2003 | Fitzergald ......... H01L 21/76256 438/455 |

(Continued)

OTHER PUBLICATIONS

Thomas Ferrotti, Design, Fabrication and Characterization of a Hybrid III-V on Silicon Transmitter for High-Speed Communications. Other. Université de Lyon, 2016. English. NNT : 2016LYSEC054. tel-01529424. pp. 1-181.

*Primary Examiner* — Michael Carter
(74) *Attorney, Agent, or Firm* — Farjami & Farjami LLP

(57) ABSTRACT

In fabricating a semiconductor structure, a group IV substrate and a group III-V chiplet are provided. The group III-V chiplet is bonded to the group IV substrate, and patterned to produce a patterned group III-V device. A blanket dielectric layer is formed over the patterned group III-V device. A first contact hole is formed in the blanket dielectric layer over a first portion of the patterned group III-V device. A first liner stack and a first filler metal are subsequently formed in the first contact hole. A second contact hole is formed in the blanket dielectric layer over a second portion of the patterned group III-V device. A second liner stack and a second filler metal are subsequently formed in the second contact hole. A first bottom metal liner of the first liner stack can be different from a second bottom metal liner of the second liner stack.

20 Claims, 19 Drawing Sheets

Related U.S. Application Data application No. 16/745,805, filed on Jan. 17, 2020, and a continuation-in-part of application No. 16/741,565, filed on Jan. 13, 2020, and a continuation-in-part of application No. 16/740,173, filed on Jan. 10, 2020.

(51) Int. Cl.
*H01L 31/0304* (2006.01)
*H01L 31/109* (2006.01)
*H01S 5/02* (2006.01)

(52) U.S. Cl.
CPC .......... *H01L 31/1844* (2013.01); *H01S 5/021* (2013.01); *H01S 5/0218* (2013.01)

(56) References Cited

U.S. PATENT DOCUMENTS

| | | |
|---|---|---|
| 7,834,456 B2 | 11/2010 | Tabatabaie et al. |
| 8,633,496 B2 | 1/2014 | Hata et al. |
| 9,318,437 B1 * | 4/2016 | He .................... H01L 23/564 |
| 9,331,076 B2 | 5/2016 | Bayram et al. |
| 2009/0016399 A1 | 1/2009 | Bowers |
| 2011/0095331 A1 | 4/2011 | Hanawa et al. |
| 2012/0288971 A1 | 11/2012 | Bogaerts et al. |
| 2015/0075599 A1 | 3/2015 | Yu et al. |
| 2016/0105247 A1 | 4/2016 | Cheng et al. |
| 2016/0148959 A1 * | 5/2016 | Cheng .................. H01L 31/028 |
| | | 257/290 |
| 2019/0189603 A1 | 6/2019 | Wang et al. |

\* cited by examiner

FABRICATION OF SEMICONDUCTOR STRUCTURE HAVING GROUP III-V DEVICE ON GROUP IV SUBSTRATE WITH SEPARATELY FORMED CONTACTS USING DIFFERENT METAL LINERS

CLAIMS OF PRIORITY

The present application is a continuation-in-part of and claims the benefit of and priority to application Ser. No. 16/740,173 filed on Jan. 10, 2020 and titled "Semiconductor Structure Having Group III-V Device on Group IV Substrate and Contacts with Precursor Stacks,". The present application is also a continuation-in-part of and claims the benefit of and priority to application Ser. No. 16/741,565 filed on Jan. 13, 2020 and titled "Semiconductor Structure Having Group III-V Device on Group IV Substrate and Contacts with Liner Stacks,". The present application is also a continuation-in-part of and claims the benefit of and priority to application Ser. No. 16/745,805 filed on Jan. 17, 2020 and titled "Semiconductor Structure Having Group III-V Device on Group IV Substrate,". The present application is further a continuation-in-part of and claims the benefit of and priority to application Ser. No. 16/792,551 filed on Feb. 17, 2020 and titled "Structure and Method for Process Control Monitoring for Group III-V Devices Integrated with Group IV Substrate,". The disclosures and contents of the above-identified applications are hereby incorporated fully by reference into the present application.

BACKGROUND

Group III-V compound semiconductors including at least one group III element, such as indium (In), gallium (Ga), aluminum (Al), and boron (B), and at least one group V element, such as arsenic (As), phosphorus (P), and nitrogen (N), have characteristics that make them advantageous for use in optical and optoelectronic devices. However, operations that are incidental to and supportive of these optical and optoelectronic devices, such as feedback, modulation, and input/output coupling, may be more easily implemented using group IV semiconductors, such as silicon.

In one approach, group III-V devices are formed separately from group IV devices, and then optically and/or electrically connected. However, inaccurate alignment of the group III-V devices could cause significant optical losses between the group III-V devices and the group IV devices. Optical losses can also increase as the separation between the group III-V devices and the group IV devices increases, for example, due to packaging or other intervening materials. Electrical connectors, such as wirebonds or solder balls, also generally increase electrical losses.

In another approach, group III-V devices are bonded to group IV devices. However, conventional techniques for forming contacts for group III-V devices employ lift-off of a metal layer, for example, a gold (Au) metal layer. These lift-off techniques leave residual materials that are difficult to clean. Gold also acts as a dopant to silicon and can have unintended consequences when integrating with group IV substrates. Moreover, group III-V devices can have extreme topographies, such as mesas having heights in excess of two microns (2 μm). These lift-off techniques result in contacts for group III-V devices being non-planar, significantly increasing the complexity of connecting the contacts to interconnect metals and vias, and often making the group III-V device incompatible with modern back-end-of-line (BEOL) multi-level metallization (MLM) schemes.

Thus, there is need in the art for efficiently and effectively integrating group III-V and group IV devices having reduced losses and complexity.

SUMMARY

The present disclosure is directed to fabrication of a semiconductor structure having a group III-V device on a group IV substrate with separately formed contacts using different metal liners, substantially as shown in and/or described in connection with at least one of the figures, and as set forth in the claims.

DETAILED DESCRIPTION

Figure 1A:
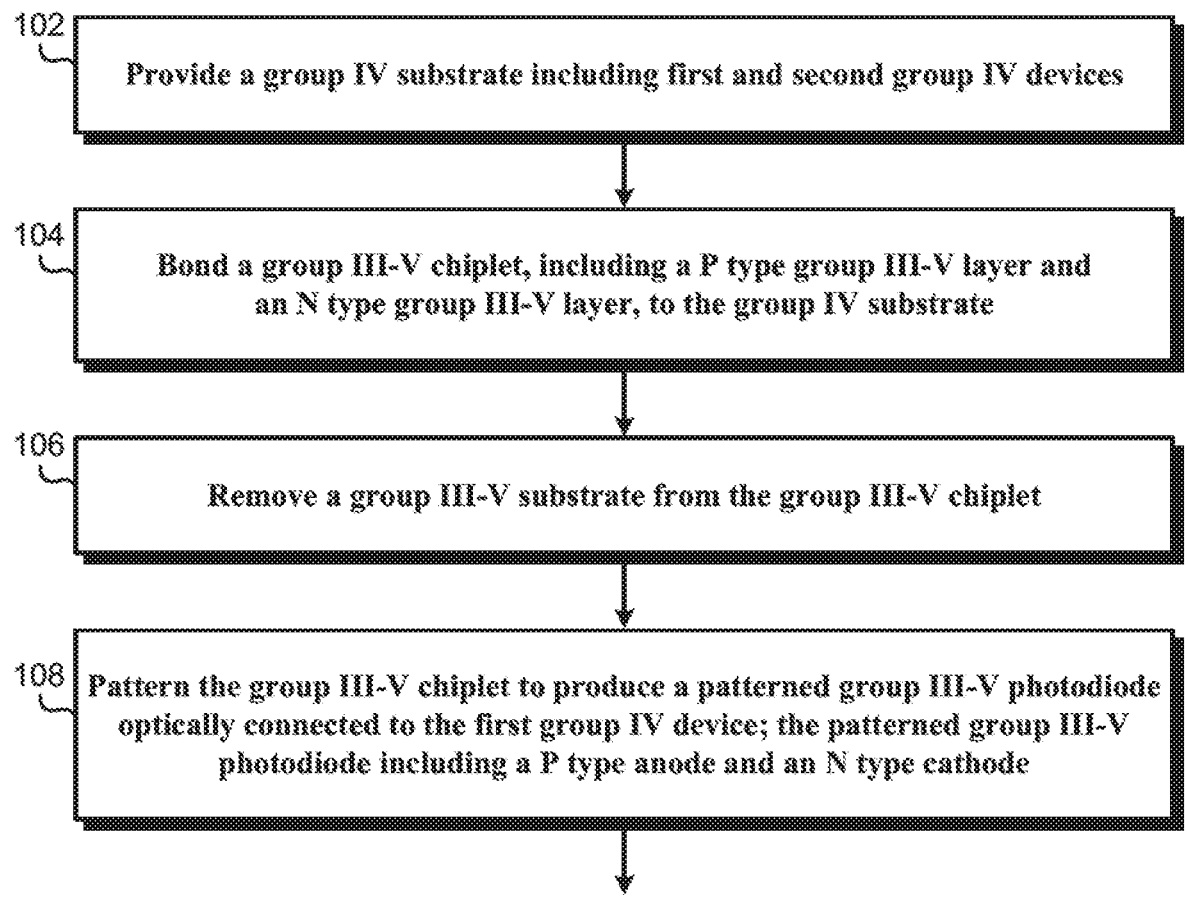
FIG. 1A illustrates a portion of a flowchart of an exemplary method for manufacturing a semiconductor structure according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 2A:
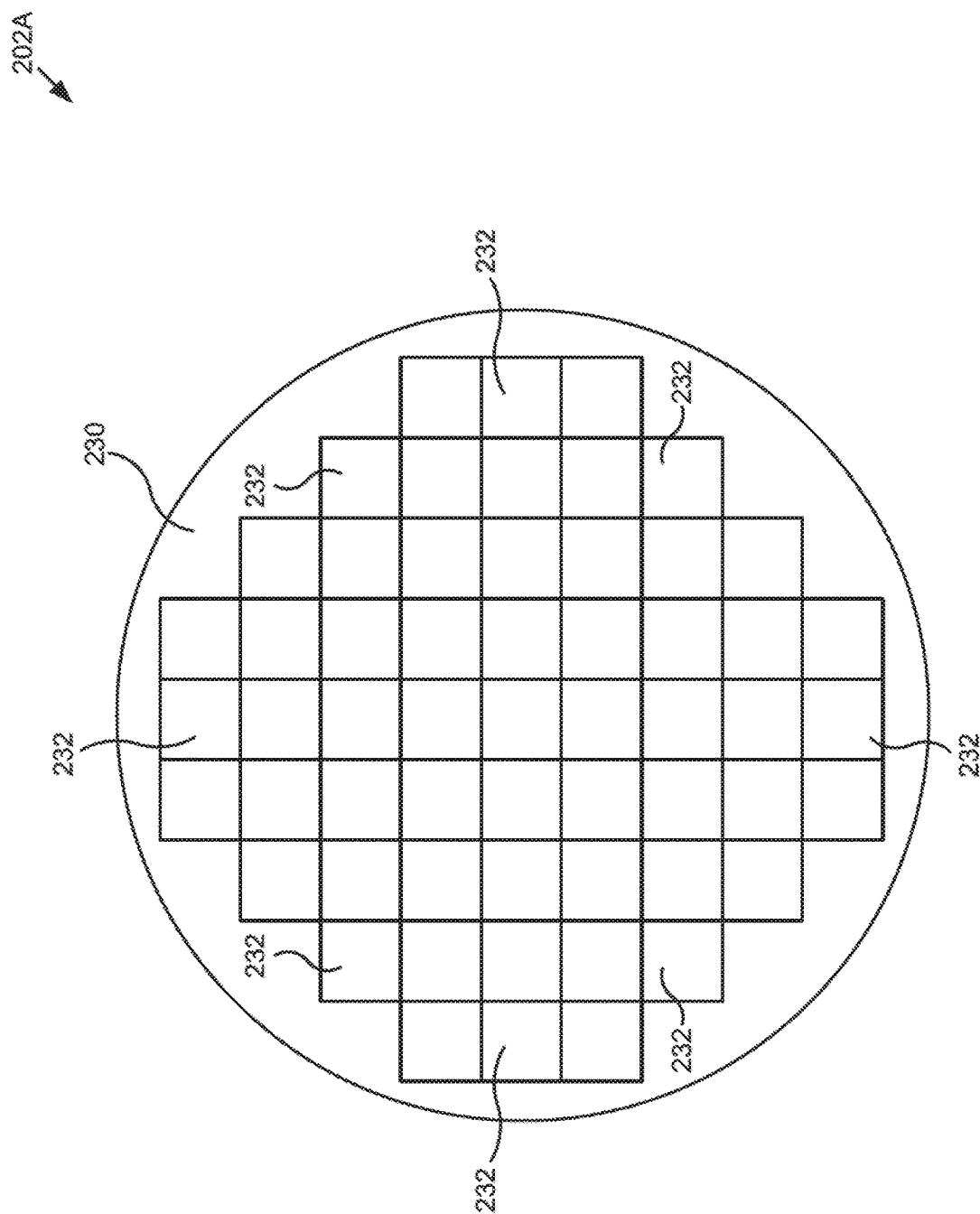
FIG. 2A illustrates a layout of a semiconductor structure processed in accordance with the flowchart of FIG. 1A according to one implementation of the present application.

FIG. 1A illustrates a portion of a flowchart of an exemplary method for manufacturing a semiconductor structure according to one implementation of the present application. Structures shown in FIGS. 2A through 5 illustrate the results of performing actions 102 through 108 shown in the flowchart of FIG. 1A. For example, FIG. 2A shows a semiconductor structure after performing action 102 in FIG. 1A, FIG. 3A shows a semiconductor structure after performing action 104 in FIG. 1A, FIG. 4 shows a semiconductor structure after performing action 106 in FIG. 1A, and so forth.

Figure 1B:
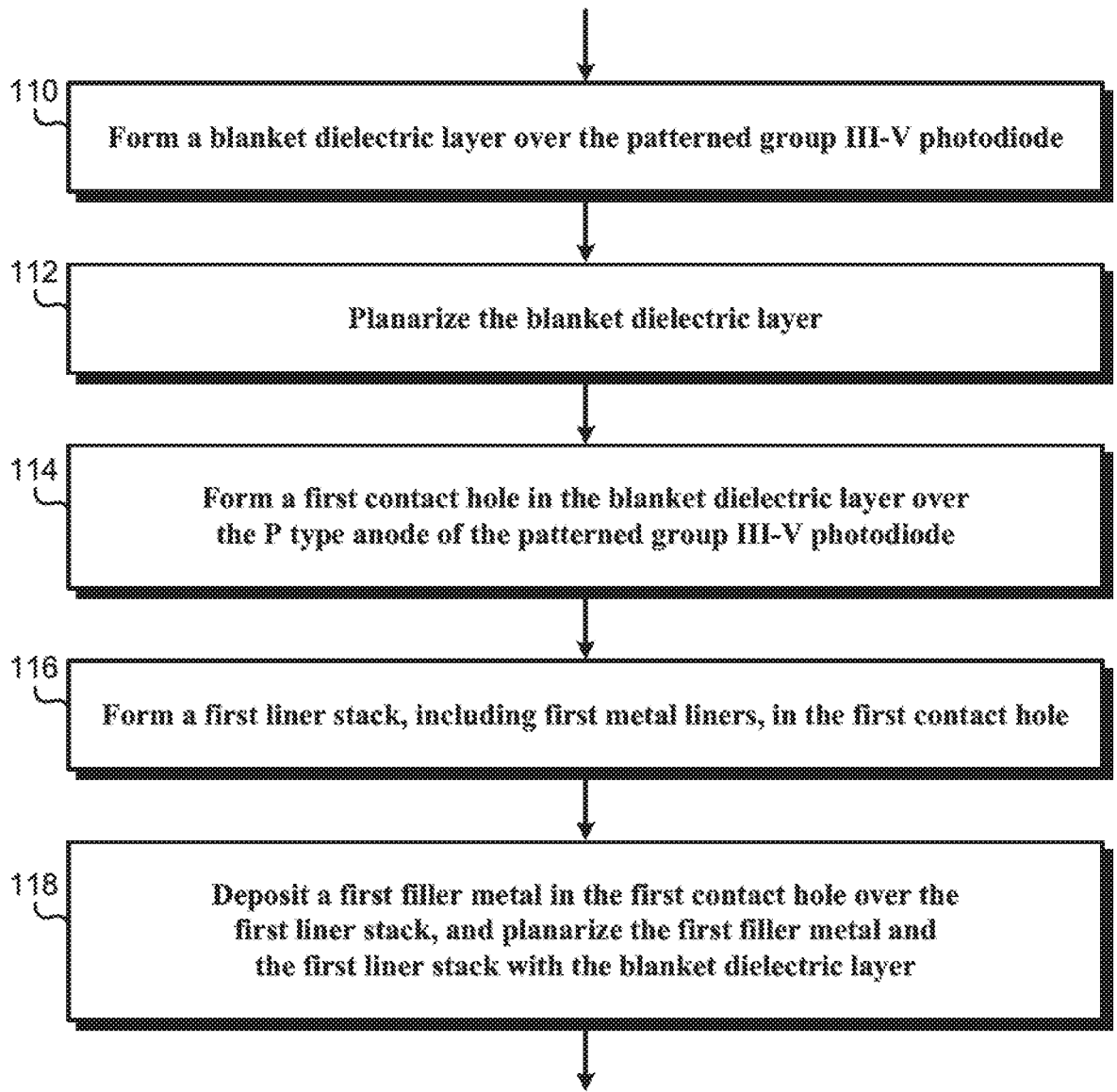
FIG. 1B illustrates a portion of a flowchart of an exemplary method for manufacturing a semiconductor structure, as a continuation to the flowchart of FIG. 1A, according to one implementation of the present application.
Figure 6:
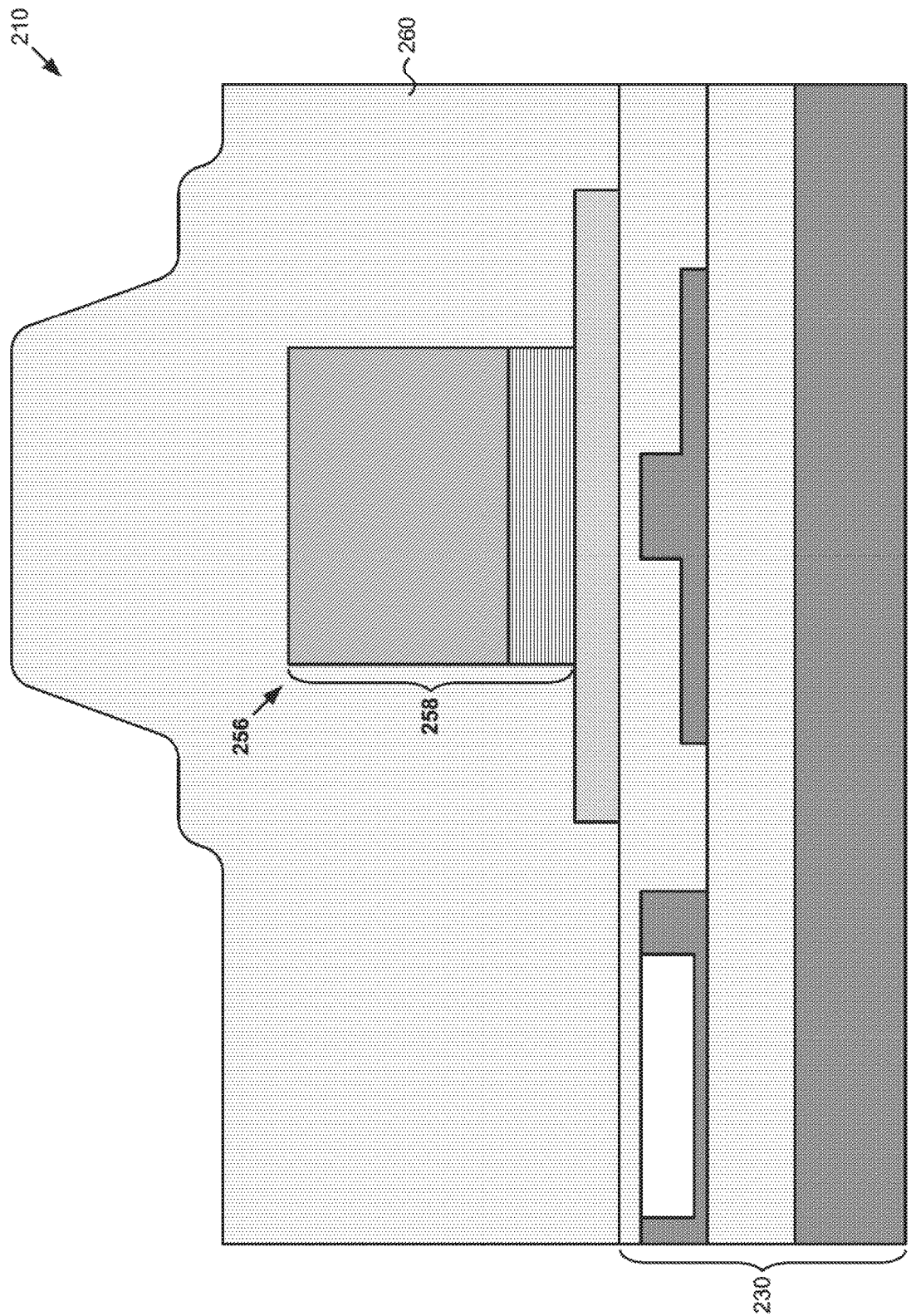
FIG. 6 illustrates a cross-sectional view of a portion of a semiconductor structure processed in accordance with the flowchart of FIG. 1B according to one implementation of the present application.
Figure 7:
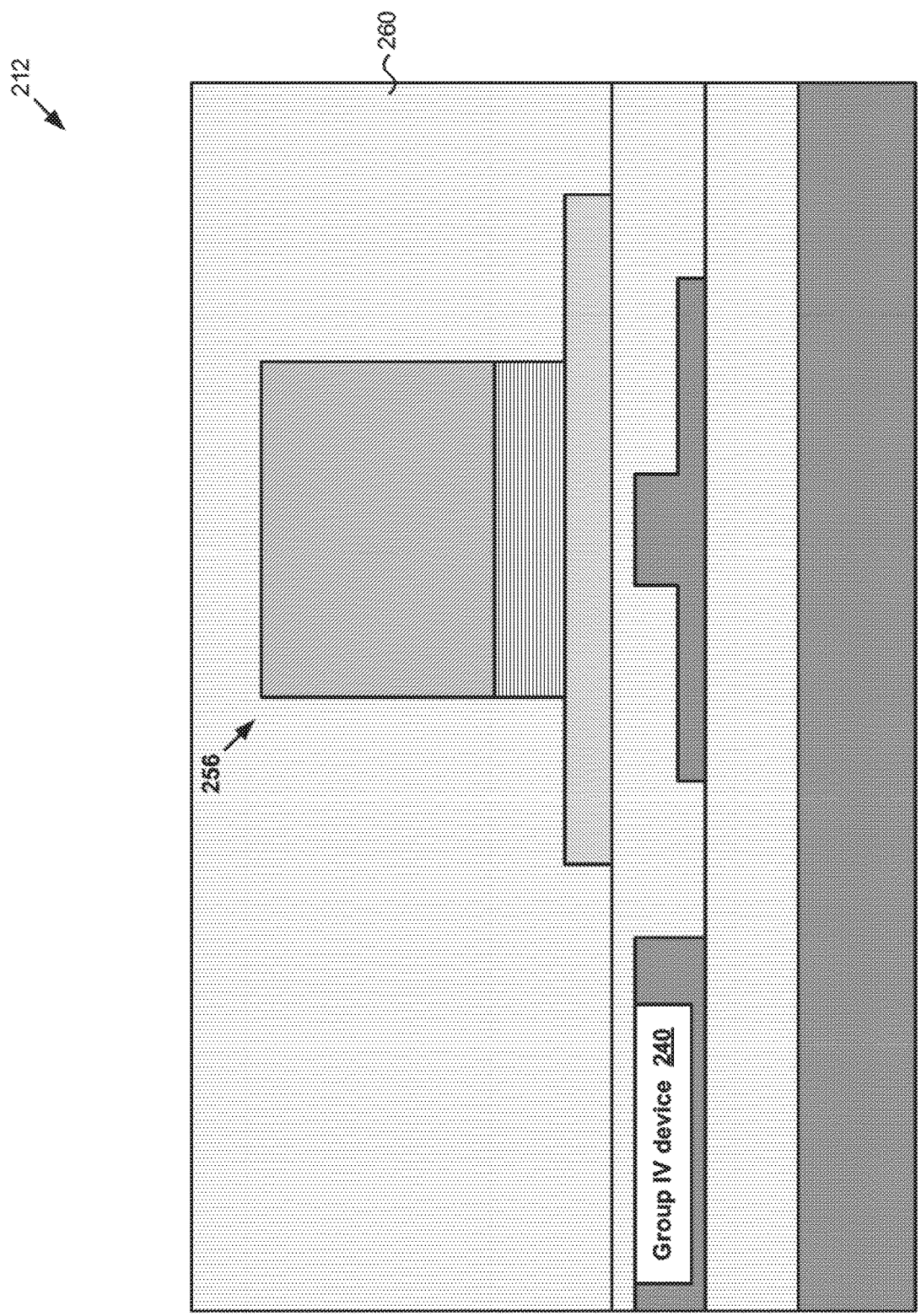
FIG. 7 illustrates a cross-sectional view of a portion of a semiconductor structure processed in accordance with the flowchart of FIG. 1B according to one implementation of the present application.

FIG. 1B illustrates a portion of a flowchart of an exemplary method for manufacturing a semiconductor structure, as a continuation to the flowchart of FIG. 1A, according to one implementation of the present application. Structures shown in FIGS. 6 through 10 illustrate the results of performing actions 110 through 118 shown in the flowchart of FIG. 1B. For example, FIG. 6 shows a semiconductor structure after performing action 110 in FIG. 1B, FIG. 7 shows a semiconductor structure after performing action 112 in FIG. 1B, and so forth.

Figure 1C:
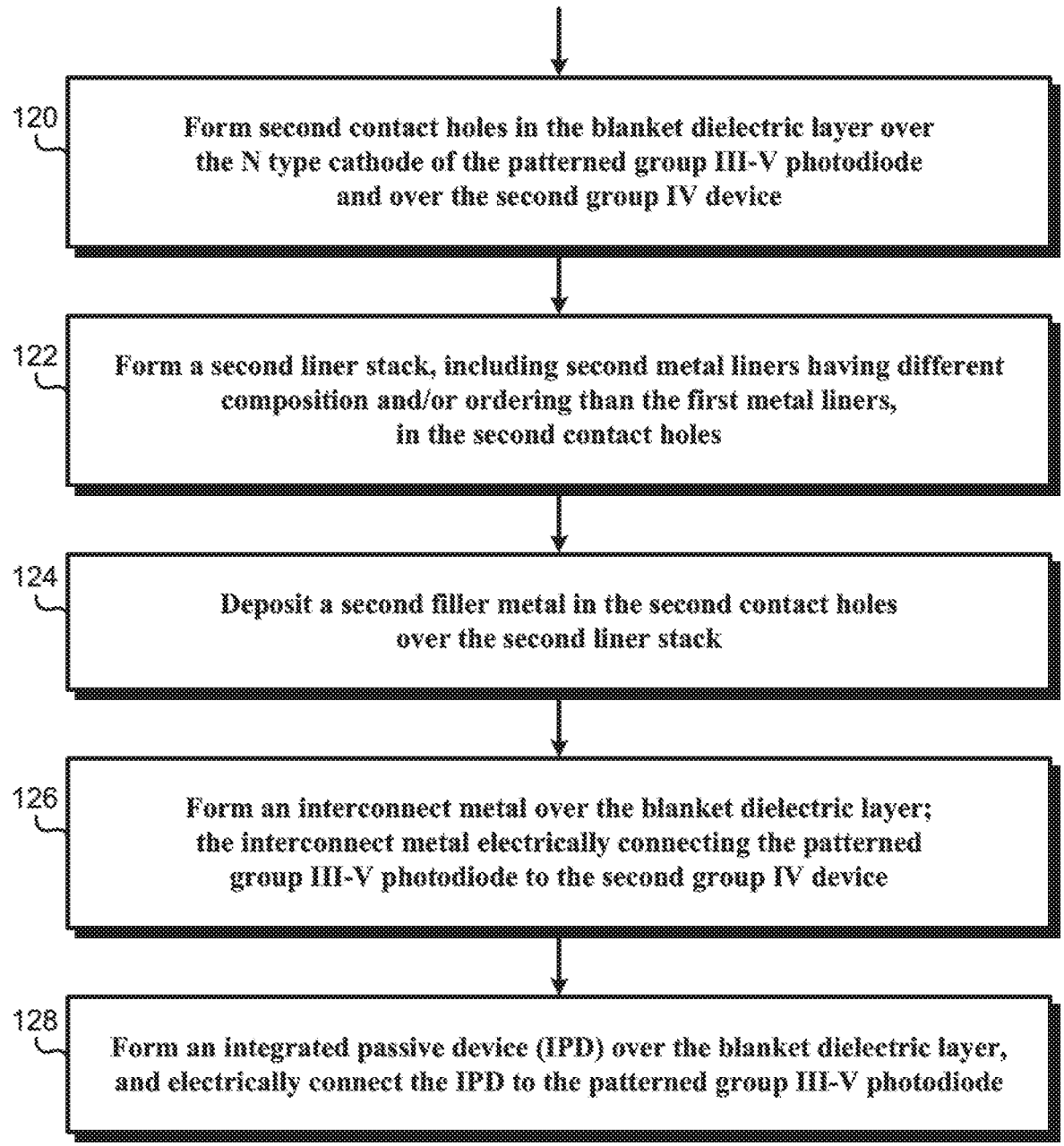
FIG. 1C illustrates a portion of a flowchart of an exemplary method for manufacturing a semiconductor structure, as a continuation to the flowcharts of FIGS. 1A and 1B, according to one implementation of the present application.
Figure 11:
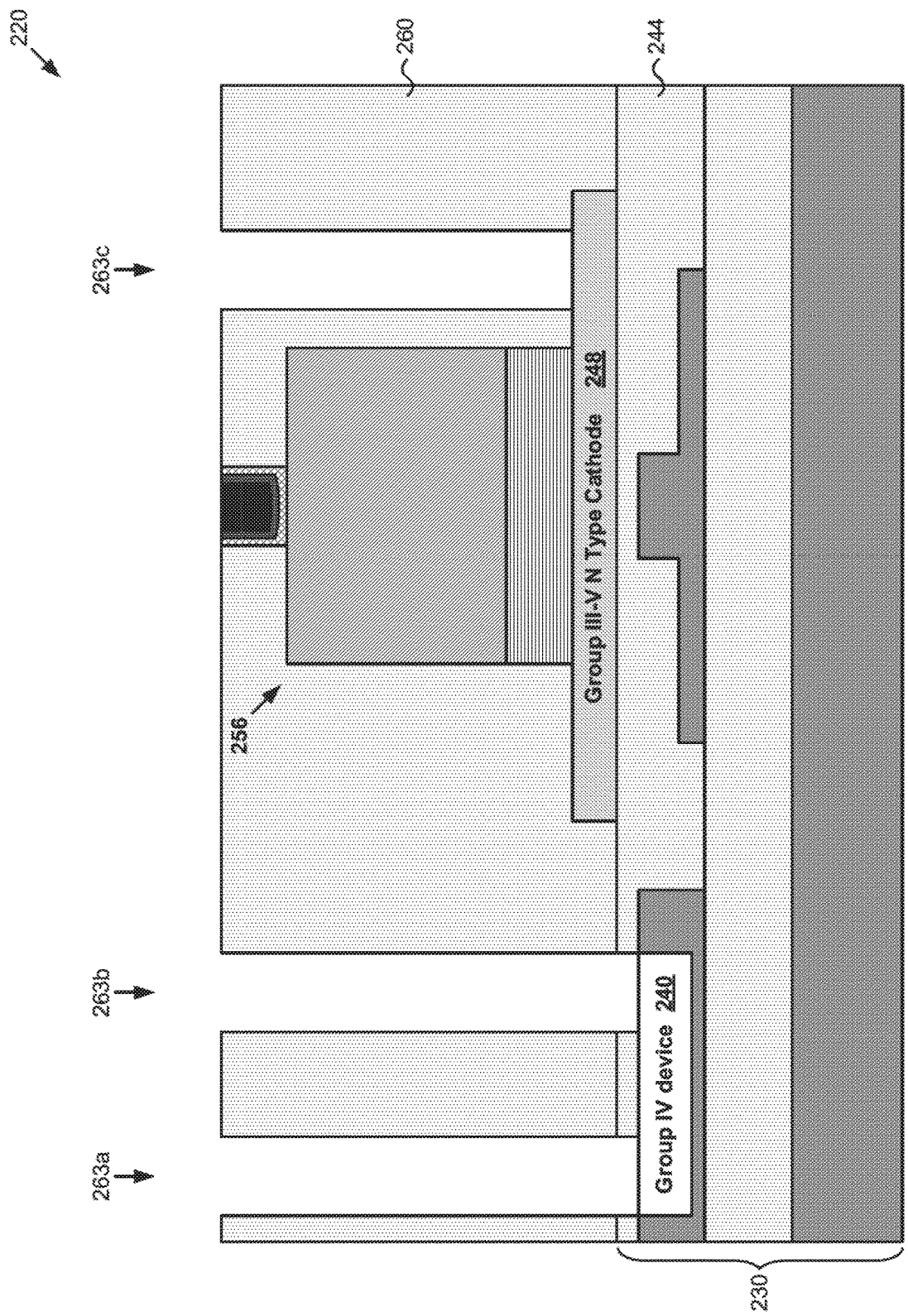
FIG. 11 illustrates a cross-sectional view of a portion of a semiconductor structure processed in accordance with the flowchart of FIG. 1C according to one implementation of the present application.
Figure 12:
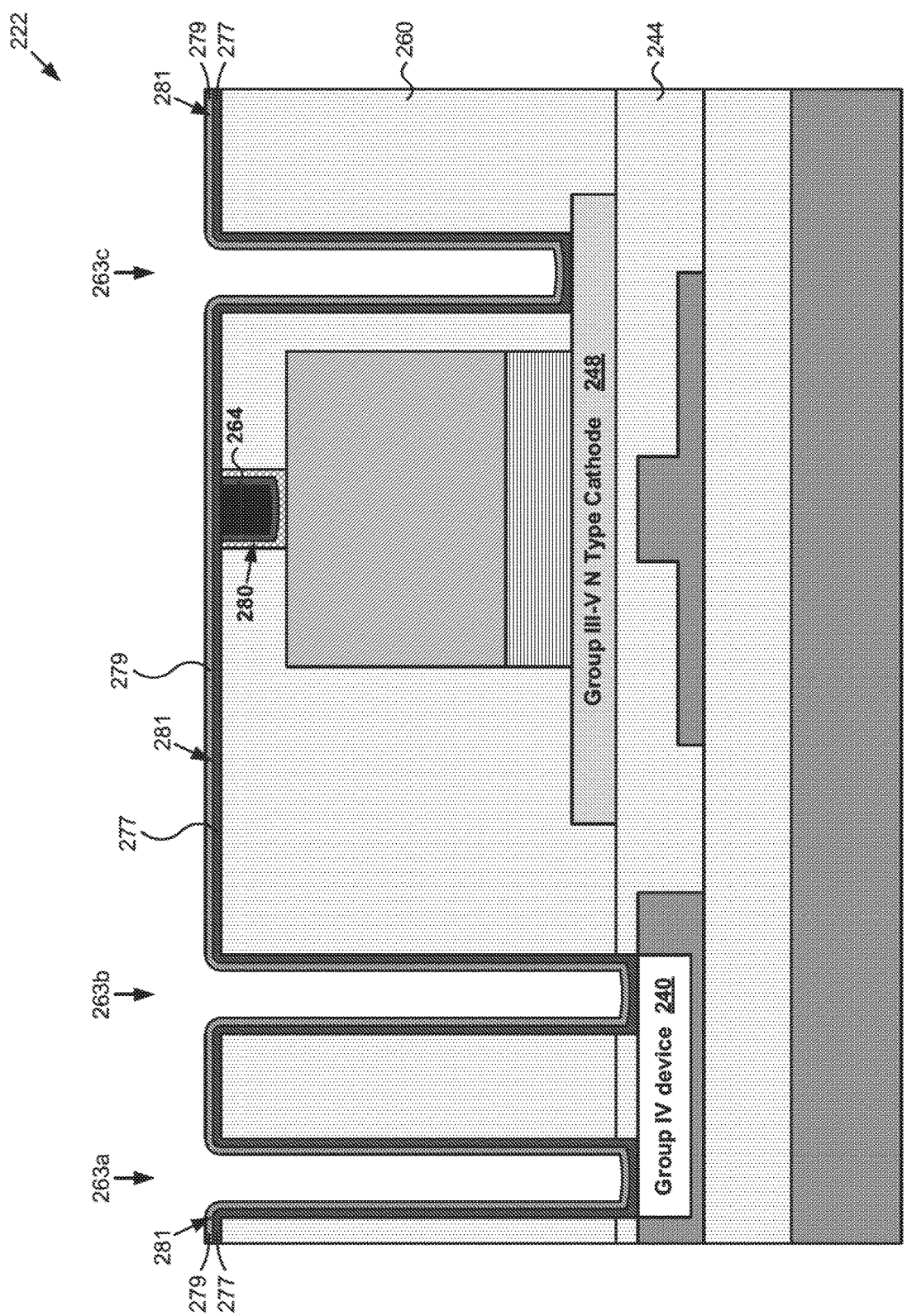
FIG. 12 illustrates a cross-sectional view of a portion of a semiconductor structure processed in accordance with the flowchart of FIG. 1C according to one implementation of the present application.

FIG. 1C illustrates a portion of a flowchart of an exemplary method for manufacturing a semiconductor structure, as a continuation to the flowcharts of FIGS. 1A and 1B, according to one implementation of the present application. Structures shown in FIGS. 11 through 15 illustrate the results of performing actions 120 through 128 shown in the flowchart of FIG. 1C. For example, FIG. 11 shows a semiconductor structure after performing action 120 in FIG. 1C, FIG. 12 shows a semiconductor structure after performing action 122 in FIG. 1C, and so forth.

Actions 102 through 124 shown in the flowcharts of FIGS. 1A, 1B, and 1C are sufficient to describe one implementation of the present inventive concepts. Other implementations of the present inventive concepts may utilize actions different from those shown in the flowcharts of FIGS. 1A, 1B, and 1C. Certain details and features have been left out of the flowcharts of FIGS. 1A, 1B, and 1C that are apparent to a person of ordinary skill in the art. For example, an action may consist of one or more sub-actions or may involve specialized equipment or materials, as known in the art. Moreover, some actions, such as masking and cleaning actions, may be omitted so as not to distract from the illustrated actions.

FIG. 2A illustrates a layout of a semiconductor structure processed in accordance with action 102 in the flowchart of FIG. 1A according to one implementation of the present application. As shown in FIG. 2A, semiconductor structure 202A is provided. Semiconductor structure 202A includes group IV substrate 230 having multiple integrated circuits (ICs) 232. As used herein, the phrase "group IV" refers to a semiconductor material that includes at least one group IV element such as silicon (Si), germanium (Ge), and carbon (C), and may also include compound semiconductors such as silicon germanium (SiGe) and silicon carbide (SiC), for example. "Group IV" also refers to semiconductor materials that include more than one layer of group IV elements, or doping of group IV elements to produce strained group IV materials, and may also include group IV based composite substrates such as silicon on insulator (SOI) substrates, separation by implantation of oxygen (SIMOX) process substrates, and silicon on sapphire (SOS) substrates, for example. In one implementation, group IV substrate 230 is an SOI wafer having a diameter of approximately two hundred millimeters (200 mm).

In various implementations, group IV substrate 230 can include greater or fewer ICs 232 than those shown, by way of examples, on group IV substrate 230 of FIG. 2A. In the present implementation, ICs 232 have an approximately square shape. In one implementation, each of ICs 232 has dimensions of approximately twenty microns by approximately twenty microns (20 µm×20 µm). In various implementations, ICs 232 can have any other shapes and/or arrangements in group IV substrate 230. As described below, each of ICs 232 can include group IV devices (not shown in FIG. 2A).

Figure 2B:
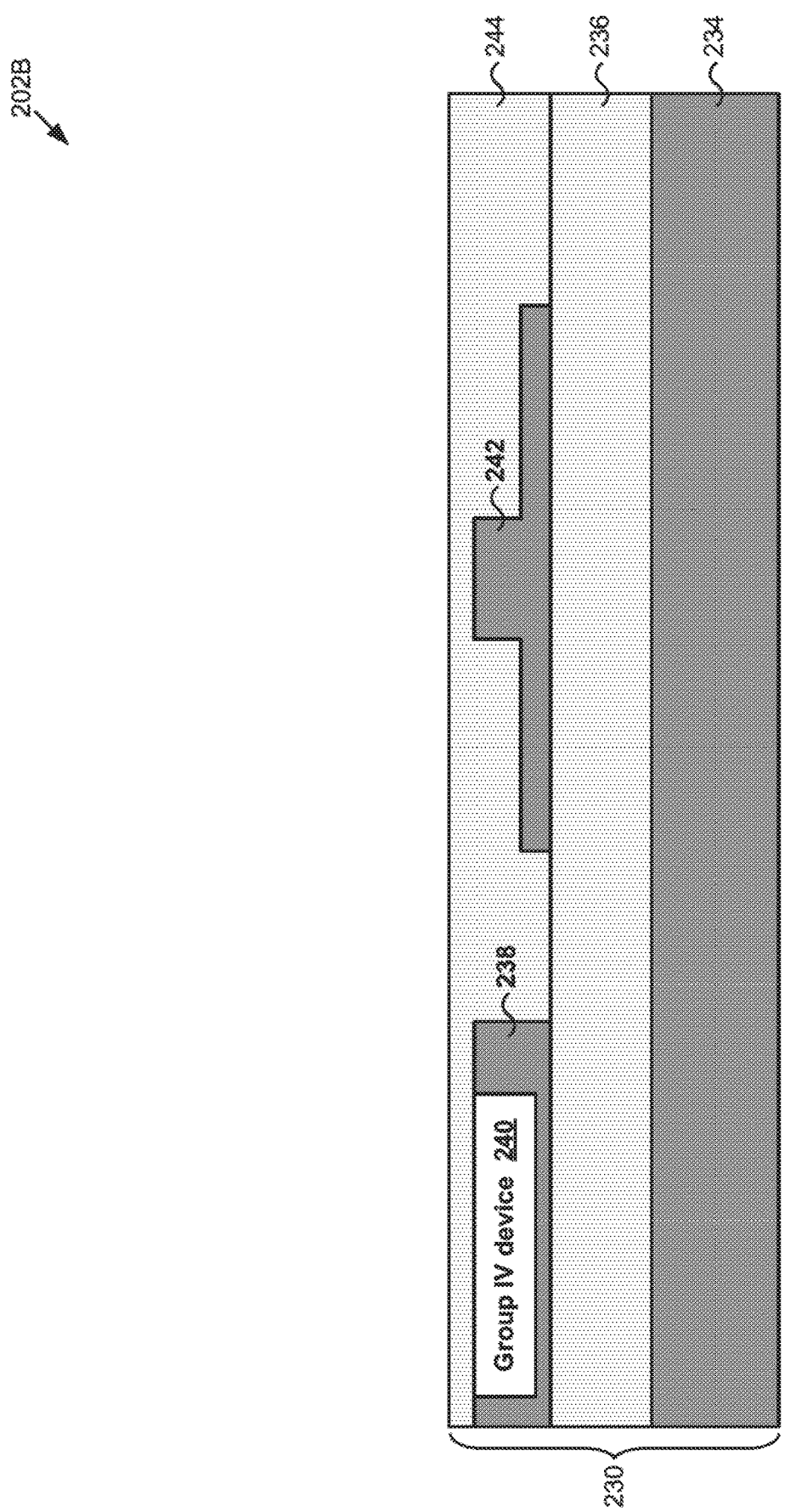
FIG. 2B illustrates a cross-sectional view of a portion of a semiconductor structure corresponding to FIG. 2A processed in accordance with the flowchart of FIG. 1A according to one implementation of the present application.
Figure 3A:
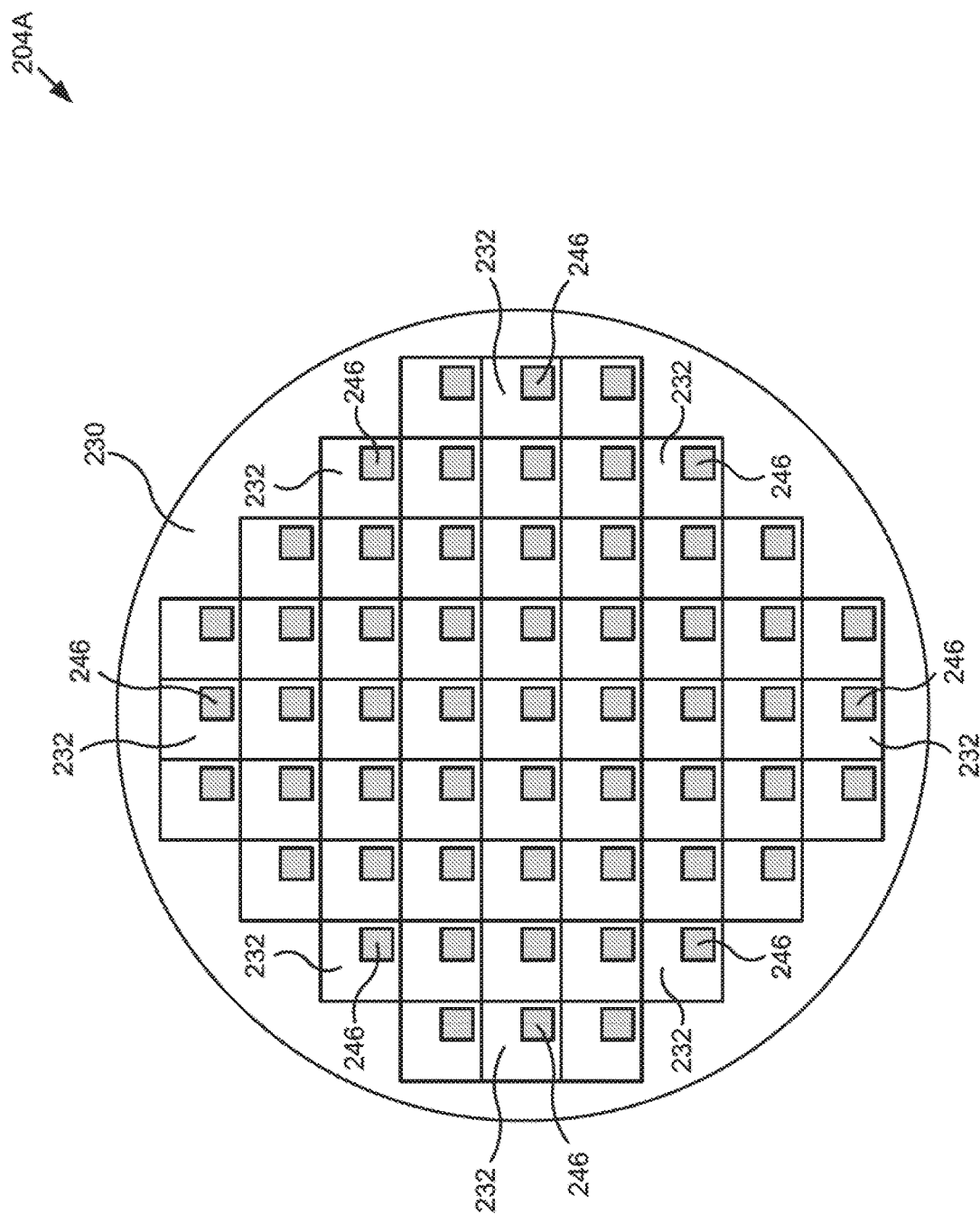
FIG. 3A illustrates a layout of a semiconductor structure processed in accordance with the flowchart of FIG. 1A according to one implementation of the present application.

FIG. 2B illustrates a cross-sectional view of a portion of a semiconductor structure corresponding to FIG. 2A processed in accordance with action 102 in the flowchart of FIG. 1A according to one implementation of the present application. The cross-sectional view in FIG. 2B generally corresponds to a portion of one of ICs 232 in FIG. 2A. As shown in FIG. 2B, semiconductor structure 202B is provided. Semiconductor structure 202B includes group IV substrate 230 having group IV devices 240 and 242. In the present implementation, group IV substrate 230 is an SOI substrate including handle wafer 234, buried oxide (BOX) 236, and top semiconductor 238. Group IV substrate also includes oxide layer 244 over top semiconductor 238.

In providing semiconductor structure 202B, a bonded and etch back SOI (BESOI) process can be used, as known in the art. In a BESOI process, handle wafer 234, BOX 236, and top semiconductor 238 together form an SOI substrate. Alternatively, as also known in the art, a SIMOX process (separation by implantation of oxygen process) or a "smart cut" process can also be used for providing semiconductor structure 202B. In a SIMOX process, handle wafer 234 can be a bulk silicon support wafer (which for ease of reference, may still be referred to as a "handle wafer" in the present application). Similar to a BESOI process, in both SIMOX and smart cut processes, handle wafer 234, BOX 236, and top semiconductor 238 together form an SOI substrate.

In one implementation, handle wafer 234 is undoped silicon. In various implementations, handle wafer 234 has a thickness of approximately seven hundred microns (700 µm) or greater or less. In one implementation, a trap rich layer can be situated between handle wafer 234 and BOX 236. In various implementations, BOX 236 typically comprises silicon dioxide ($SiO_2$), but it may also comprise silicon nitride ($Si_xN_Y$), or another insulator material. In various implementations, BOX 236 has a thickness of approximately one micron (1 µm) or greater or less. In one implementation, top semiconductor 238 includes doped silicon. In various implementations, top semiconductor 238 has a thickness of approximately three hundred nanometers (300 nm) or greater or less. Handle wafer 234, BOX 236, and top semiconductor 238 can be provided together in group IV substrate 230 as a pre-fabricated SOI substrate. In various implementations, as discussed above, group IV substrate 230 may be any other group IV substrate.

Group IV substrate 230 includes group IV devices 240 and 242. In the present implementation, group IV device 240 is an electrical device, and group IV device 242 is an optical or optoelectronic device. In various implementations, group IV device 240 can be a transistor, an operational amplifier, a driver, a filter, a mixer, or a diode. In various implementations, group IV device 240 can be an active circuit comprising multiple active devices, or comprising passive devices in combination with at least one active device. In various implementations, group IV device 242 can be a waveguide, grating coupler, or an interferometer. In other implementations, group IV devices 240 and 242 can be any other types of group IV devices.

Group IV devices 240 and 242 are formed in top semiconductor 238. In semiconductor structure 202B, part of top semiconductor 238 is removed to isolate group IV device 240 from group IV device 242. In other implementations, dedicated isolation structures can be used. Other group IV devices (not shown in FIG. 2B) can be integrated in top semiconductor 238. Oxide layer 244 is situated over group IV devices 240 and 242 in group IV substrate 230. In various implementations, oxide layer 244 can comprise silicon oxide ($SiO_2$), silicon onynitride ($Si_xO_YN_Z$), or another dielectric. In various implementations, the height of oxide layer 244 above group IV devices 240 and 242 can be approximately one hundred nanometers (100 nm).

FIG. 3A illustrates a layout of a semiconductor structure processed in accordance with action 104 in the flowchart of FIG. 1A according to one implementation of the present application. As shown in FIG. 3A, in semiconductor structure 204A, group III-V chiplets 246 are bonded to group IV substrate 230.

Group III-V chiplets 246 are unpatterned dies including group III-V semiconductors. As used herein, the phrase "group III-V" refers to a compound semiconductor including at least one group III element, such as indium (In), gallium (Ga), aluminum (Al), and boron (B), and at least one group V element, such as arsenic (As), phosphorus (P), and nitrogen (N). By way of example, a group III-V semiconductor may take the form of indium phosphide (InP). "Group III-V" can also refer to a compound semiconductor that includes an alloy of a group III element and/or an alloy of a group V element, such as indium gallium arsenide ($In_xGa_{1-x}As$), indium gallium nitride ($In_xGa_{1-x}N$), aluminum gallium nitride ($Al_xGa_{1-x}N$), aluminum indium gallium nitride ($Al_xIn_YGa_{1-X-Y}N$), gallium arsenide phosphide nitride ($GaAs_AP_BN_{1-A-B}$), and aluminum indium gallium arsenide phosphide nitride ($Al_xIn_YGa_{1-X-Y}As_AP_BN_{1-A-B}$), for example. "Group III-V" also refers generally to any polarity including but not limited to Ga-polar, N-polar, semi-polar, or non-polar crystal orientations. A group III-V material may also include either the Wurtzitic, Zincblende, or mixed polytypes, and may include single-crystal, monocrystalline, polycrystalline, or amorphous structures.

Group III-V chiplets 246 can be provided by growing multiple epitaxial layers on a group II-V substrate, as described below, and then dicing the group III-V substrate and the epitaxial layers into group III-V chiplets 246. In one implementation, group III-V chiplets 246 can be formed from an InP wafer having a diameter of approximately one hundred millimeters (100 mm). In the present implementation, one of group III-V chiplets 246 is bonded to each IC 232. In other implementations, more or fewer group III-V chiplets 246 can be bonded to each IC 232.

Figure 3B:
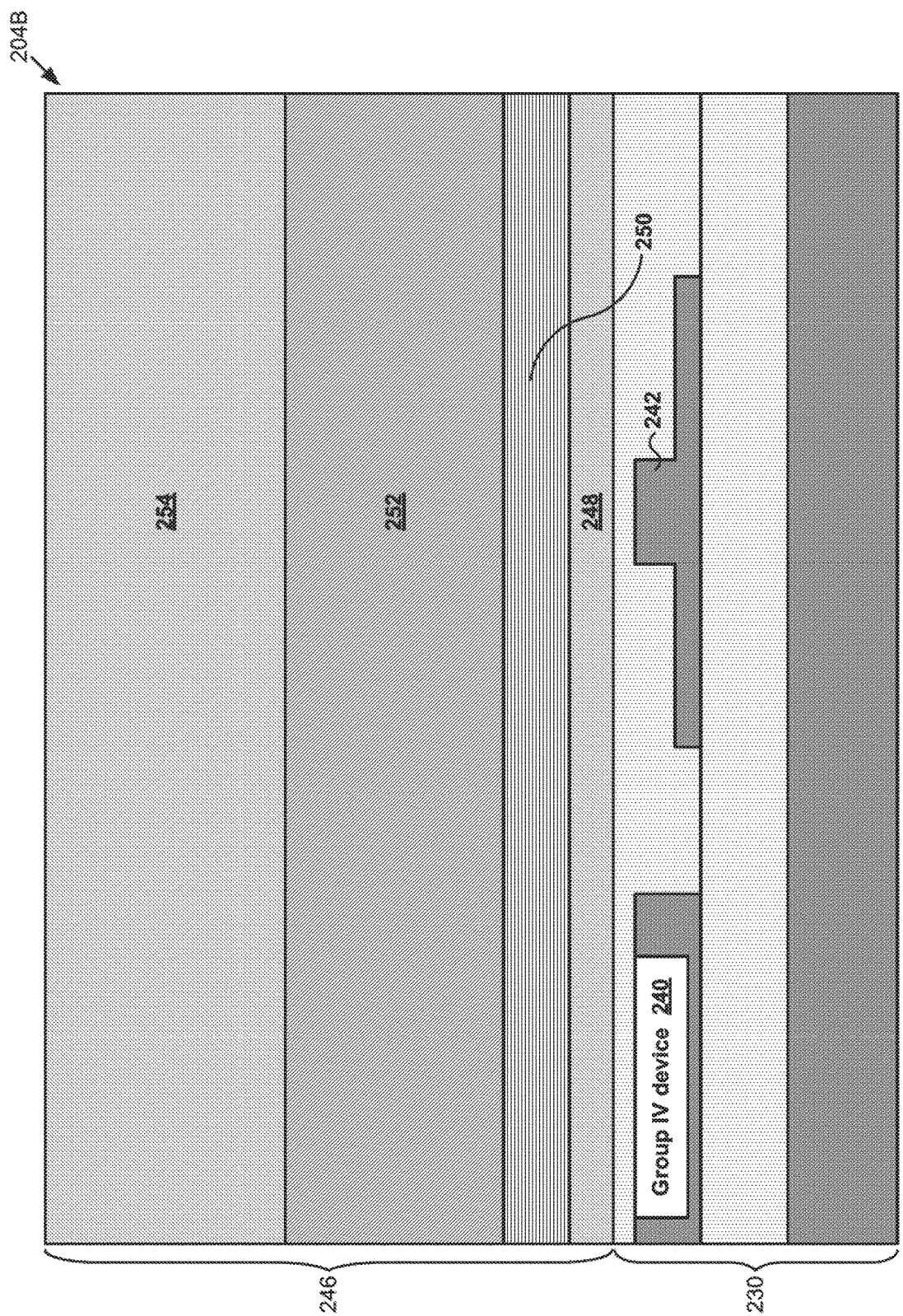
FIG. 3B illustrates a cross-sectional view of a portion of a semiconductor structure corresponding to FIG. 3A processed in accordance with the flowchart of FIG. 1A according to one implementation of the present application.
Figure 4:
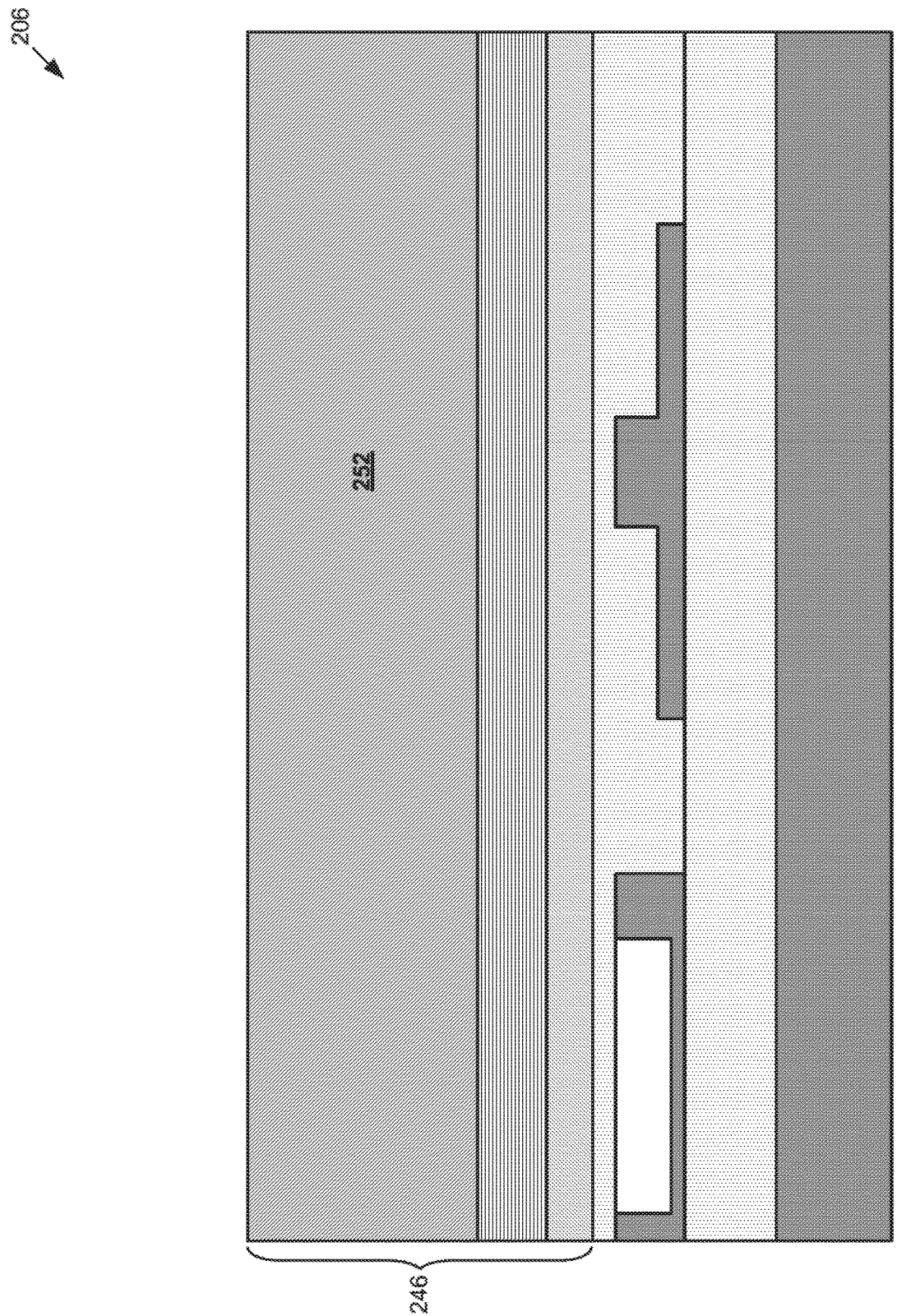
FIG. 4 illustrates a cross-sectional view of a portion of a semiconductor structure processed in accordance with the flowchart of FIG. 1A according to one implementation of the present application.

FIG. 3B illustrates a cross-sectional view of a portion of a semiconductor structure corresponding to FIG. 3A processed in accordance with action 104 in the flowchart of FIG. 1A according to one implementation of the present application. The cross-sectional view in FIG. 3B generally corresponds to a portion of one of ICs 232 in FIG. 3A. As shown in FIG. 3B, in semiconductor structure 204B, group III-V chiplet 246 is bonded to group IV substrate 230.

Group III-V chiplet 246 includes doped group III-V layer 248, transition layers 250, doped group III-V layer 252, and group III-V substrate 254. Prior to bonding to group IV substrate 230, group III-V chiplet 246 can be fabricated by sequential epitaxial growth of doped group III-V layer 252, transition layers 250, and doped group III-V layer 248 on group III-V substrate 254. In various implementations, group III-V substrate 254 can be an InP substrate having a thickness of approximately two hundred microns (200 µm) or greater or less.

In the present implementation, doped group III-V layer 252 comprises InGaAs implanted with boron or another appropriate P type dopant. In various implementations, doped group III-V layer 252 has a thickness of approximately two microns (2 µm) or greater or less. As known in the art, doped group III-V layer 252 can comprise a thin heavily doped contact layer near group III-V substrate 254 and a thick lightly doped cladding layer near transition layers 250. In various implementations, doped group III-V layer 252 can include other group III-V materials instead of or in addition to InGaAs.

In the present implementation, transition layers 250 comprise several undoped InGaAsP layers each having a thickness of approximately ten nanometers (10 nm). These layers function as quantum wells to provide optical gain. As known in the art, transition layers 250 can also comprise confinement layers around the quantum wells and having lower refractive index. In various implementations, transition layers 250 have a combined thickness of approximately two hundred nanometers (200 nm) or greater or less. In various implementations, transition layers 250 can include other group III-V materials instead of or in addition to InGaAsP.

Doped group III-V layer 248 is a group III-V layer having an opposite doping type than doped group III-V layer 252. In the present implementation, doped group III-V layer 248 comprises InP implanted with phosphorus or another appropriate N type dopant. In various implementations, doped group III-V layer 248 has a thickness of approximately one hundred nanometers (100 nm) or greater or less. In various implementations, doped group III-V layer 248 can include other group III-V materials instead of or in addition to InP.

Group III-V chiplet 246 can be bonded to group IV substrate 230 by oxygen plasma assisted direct wafer bonding. The surfaces of group III-V chiplet 246 and group IV substrate 230 can be cleaned, then activated by an oxygen plasma, then placed in physical contact at room temperature to bond. In one implementation, after bonding, a low-temperature anneal can also be performed. For example, semiconductor structure 204B can be annealed at a temperature of approximately three hundred degrees Celsius (300° C.).

In semiconductor structure 204B, doped group III-V layer 252, transition layers 250, and doped group III-V layer 248 form a P-I-N junction. Thus, group III-V chiplet 246 represents an unpatterned III-V die, suitable for patterning into an optoelectronic device, such as a laser or photodiode. As described below, doped group III-V layers 248 and 252 can function as an N type cathode and a P type anode, respectively, of a group III-V photodiode. Although an example of N type doped group III-V layer 248 and P type doped group III-V layer 252 is described above, in one implementation, the dopant types can be switched (i.e., P type doped group III-V layer 248 and N type doped group III-V layer 252). In other implementations, group III-V chiplet 246 can have other layering suitable for other devices. In other implementations, some patterning may be performed prior to bonding. In semiconductor structure 204B, group III-V chiplet 246 is shown to overlie both group IV devices 242 and 240. In other implementations, group III-V chiplet 246 may overlie more or fewer group IV devices of group IV substrate 230. For example, group IV device 240 can be situated in an area of IC 232 (shown in FIG. 3A) that does not underlie group III-V chiplet 246.

FIG. 4 illustrates a cross-sectional view of a portion of a semiconductor structure processed in accordance with action 106 in the flowchart of FIG. 1A according to one implementation of the present application. As shown in FIG. 4, in semiconductor structure 206, group III-V substrate 254 (shown in FIG. 3B) is removed from group III-V chiplet 246.

Group III-V substrate 254 (shown in FIG. 3B) can be removed using any means known in the art. For example, group III-V substrate 254 (shown in FIG. 3B) can be removed by grinding and/or chemical mechanical polishing (CMP), followed by wet etching using a hydrogen chloride (HCl) mixture. In various implementations, group III-V substrate 254 (shown in FIG. 3B) can be selectively etched while doped group III-V layer 252 or another sacrificial layer (not shown) performs as an etch stop.

Figure 5:
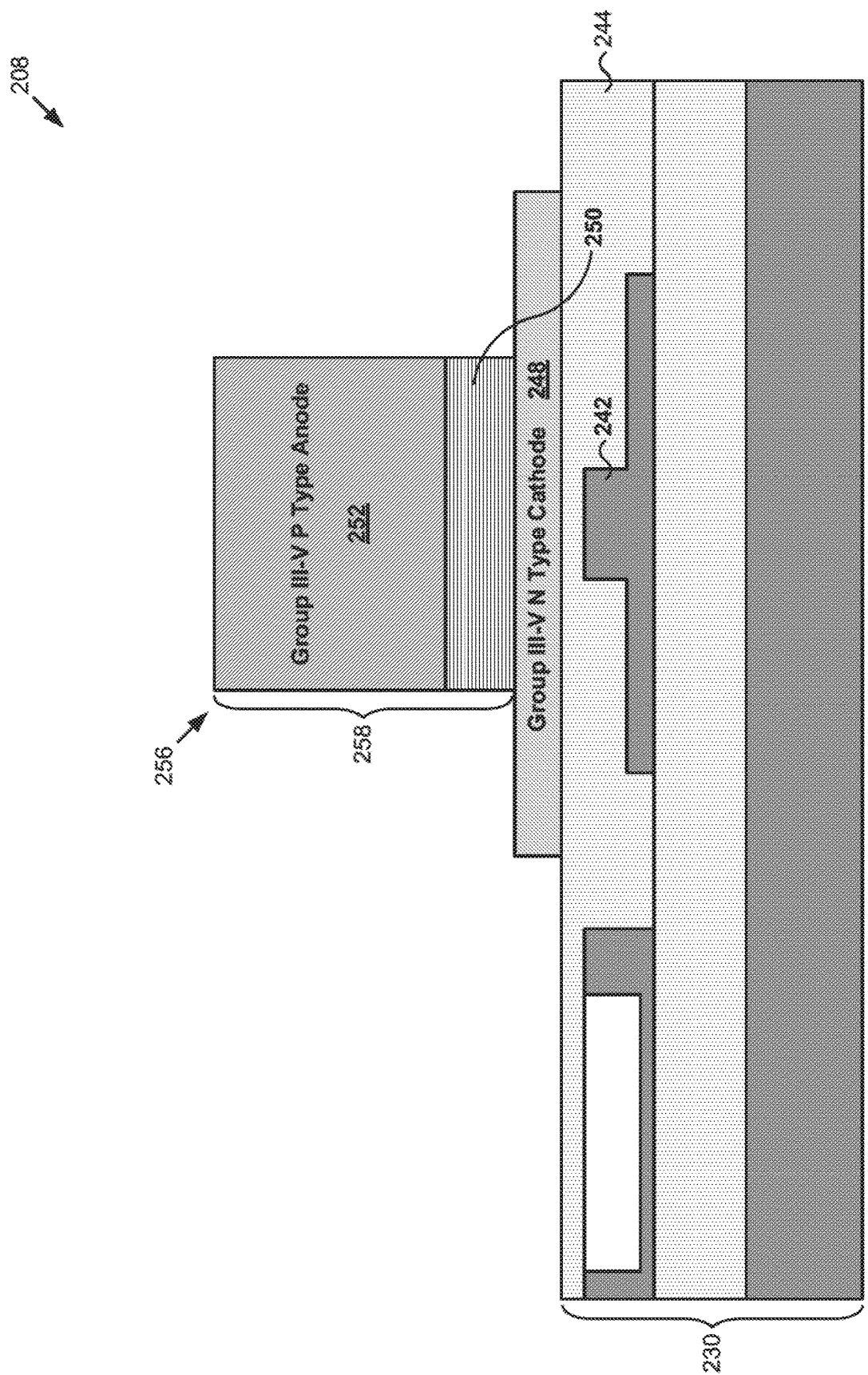
FIG. 5 illustrates a cross-sectional view of a portion of a semiconductor structure processed in accordance with the flowchart of FIG. 1A according to one implementation of the present application.

FIG. 5 illustrates a cross-sectional view of a portion of a semiconductor structure processed in accordance with action 108 in the flowchart of FIG. 1A according to one implementation of the present application. As shown in FIG. 5, in semiconductor structure 208, group III-V chiplet 246 (shown in FIG. 4) is patterned to produce patterned group III-V photodiode 256 (that is used merely as one example of a group III-V device).

Patterned group III-V photodiode 256 can be formed by depositing and patterning a hardmask, for example a $Si_XN_Y$ hardmask, over doped group III-V layer 252, then etching doped group III-V layer 252 using a phosphorus (P) based wet etch. In this implementation, doped group III-V layer 252 may be selectively etched while transition layers 250 perform as an etch stop. Then transition layers 250 can be etched, for example, using a reactive ion etch (RIE). Finally, doped group III-V layer 248 can be etched, for example, by patterning another mask and using a bromine (Br) based wet etch.

Doped group III-V layers 248 and 252 function as an N type cathode and a P type anode, respectively, of patterned group r-V photodiode 256. Accordingly, after patterning, doped group III-V layers 248 and 252 may also be referred to as group III-V N type cathode 248 and group III-V P type anode 252, respectively, in the present application. As shown in FIG. 5, after forming patterned group III-V photodiode 256, group III-V mesa 258 is situated over group III-V N type cathode 248. Group III-V mesa 258 includes transition layers 250 and group III-V P type anode 252. In order for patterned group III-V photodiode 256 to avoid significant optical losses, in various implementations, a height of group III-V mesa 258 may be approximately two microns (2 μm) or greater. In various implementations, semiconductor structure 208 can include any other patterned group III-V device, such as a laser, instead of or in addition to patterned group III-V photodiode 256.

Patterned group III-V photodiode 256 is optically connected to group IV device 242 in group IV substrate 230. Patterned group III-V photodiode 256 is approximately aligned with group IV device 242. Patterned group III-V photodiode 256 is separated from group IV device 242 by a thin portion of oxide layer 244 that was used to protect group IV devices 240 and 242 during bonding action 104 (shown in FIG. 3B). As described above, in various implementations, group IV device 242 can be a waveguide, grating coupler, or an interferometer. In one implementation, group IV device 242 may couple light to/from patterned group III-V photodiode 256 from/to another plane not visible in the cross-sectional view of FIG. 5. In another implementation, group IV device 242 may couple light to/from patterned group III-V photodiode 256 from/to a bottom of group IV substrate 230. In various implementations, patterned group III-V photodiode 256 can be optically connected to additional group IV devices (not shown in FIG. 5) in group IV substrate 230. Similarly, group IV device 242 can be optically connected to additional group IV devices (not shown in FIG. 5) in group IV substrate 230 and/or to an optical input/output interface (not shown in FIG. 5).

FIG. 6 illustrates a cross-sectional view of a portion of a semiconductor structure processed in accordance with action 110 in the flowchart of FIG. 1B according to one implementation of the present application. As shown in FIG. 6, in semiconductor structure 210, blanket dielectric layer 260 is formed over patterned group III-V photodiode 256 and over portions of group IV substrate 230.

In various implementations, blanket dielectric layer 260 is $SiO_2$, $Si_XN_Y$, or another dielectric. Blanket dielectric layer 260 can be formed, for example, by plasma enhanced chemical vapor deposition (PECVD) or high density plasma CVD (HDP-CVD). Notably, although the exact topography of blanket dielectric layer 260 will depend on the formation process used, the topography of blanket dielectric layer 260 generally mirrors that of patterned group III-V photodiode 256. In particular, blanket dielectric layer 260 protrudes in a region above group III-V mesa 258 of patterned group III-V photodiode 256. In order to ensure that blanket dielectric layer 260 covers group III-V mesa 258, in one implementation, a deposition thickness of blanket dielectric layer 260 can be significantly greater than a height of group III-V mesa 258. For example, the deposition thickness of blanket dielectric layer 260 can be approximately three microns (3 μm) or greater.

FIG. 7 illustrates a cross-sectional view of a portion of a semiconductor structure processed in accordance with action 112 the flowchart of FIG. 1B according to one implementation of the present application. As shown in FIG. 7, in semiconductor structure 212, blanket dielectric layer 260 is planarized.

In one implementation, CMP is utilized to planarize blanket dielectric layer 260. Planarizing blanket dielectric layer 260 as shown in FIG. 7 allows subsequent masks, subsequent etches, and subsequent metal formations to be performed with more reliable alignment, and allows other planar layers to be deposited above semiconductor structure 212. It is noted that, while action 112 results in blanket dielectric layer 260 being substantially planar, blanket dielectric layer 260 may not necessarily have uniform thickness along semiconductor structure 212. For example, due to normal process variations associated with planarization, a thickness of blanket dielectric layer 260 overlying group IV device 240 can be greater than a thickness of blanket dielectric layer 260 overlying patterned group III-V photodiode 256.

Figure 8:
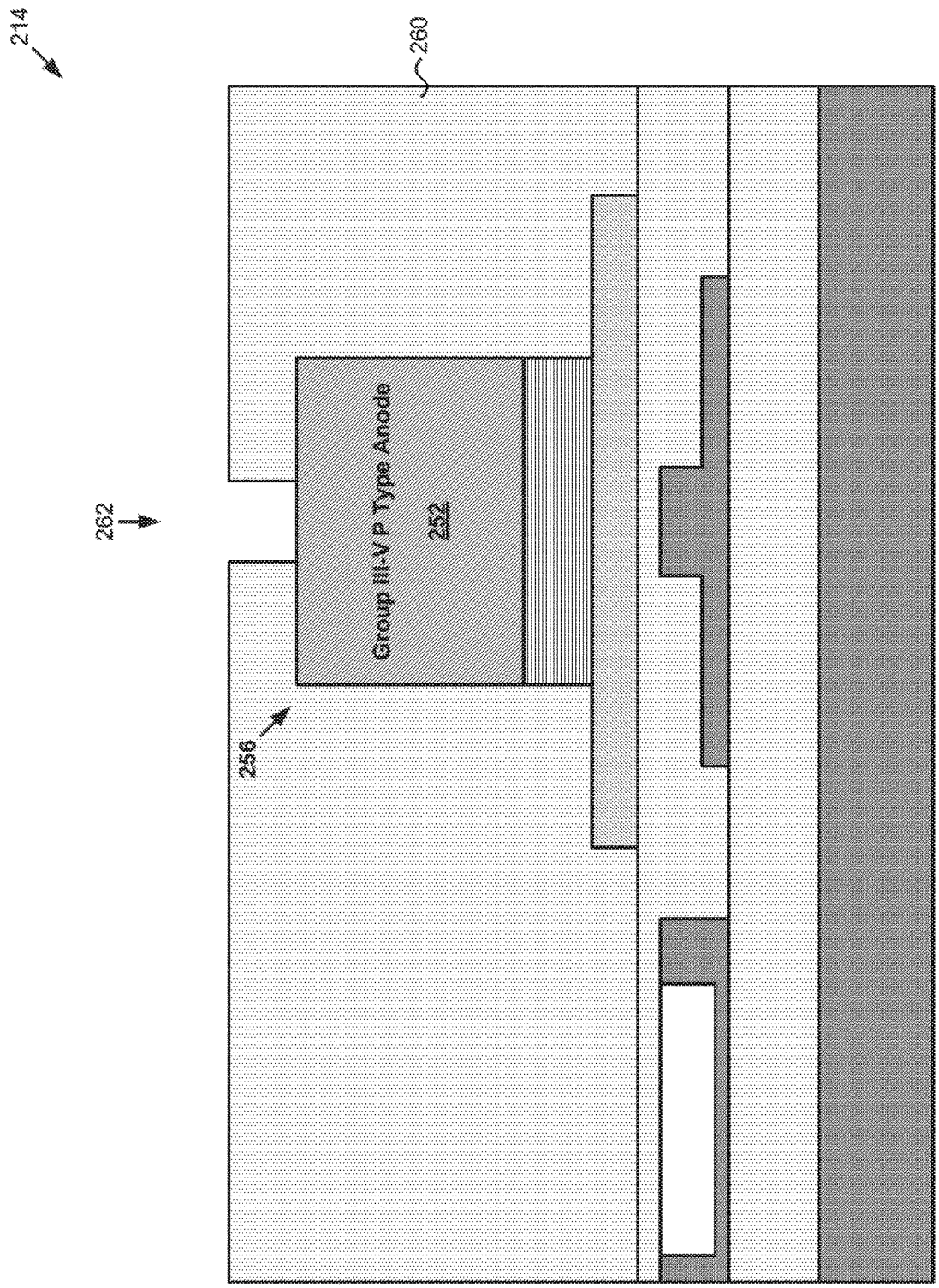
FIG. 8 illustrates a cross-sectional view of a portion of a semiconductor structure processed in accordance with the flowchart of FIG. 1B according to one implementation of the present application.

FIG. 8 illustrates a cross-sectional view of a portion of a semiconductor structure processed in accordance with action 114 in the flowchart of FIG. 1B according to one implementation of the present application. As shown in FIG. 8, in semiconductor structure 214, contact hole 262 is formed in blanket dielectric layer 260 over group III-V P type anode 252 of patterned group III-V photodiode 256. Contact hole 262 extends through a portion of blanket dielectric layer 260 to group III-V P type anode 252.

Contact hole 262 can be formed, for example, using a fluorine-based plasma dry etch. In various implementations, etch stop layers (not shown in FIG. 8) can be situated over group III-V P type anode 252, and forming contact hole 262 can comprise two different etching actions. For example, after forming patterned group III-V photodiode 256 (as shown in FIG. 5), a nitride etch stop layer can be deposited and patterned over group III-V photodiode 256.

Referring back to FIG. 8, a first etching action can be performed, for example, using a fluorine-based plasma dry etch, to selectively etch blanket dielectric layer 260 down to the etch stop layer (not shown in FIG. 8) situated over group III-V photodiode 256. Blanket dielectric layer 260 can be aggressively etched during this first etching action without etching group III-V P type anode 252. Then a second etching action can be performed, for example, using a chlorine-based plasma dry etch, in order to remove the etch stop layer (not shown in FIG. 8). This second etching action can be a short etching action that can be accurately timed to stop at the top surface of group III-V P type anode 252, with minimal or substantially no etching of group III-V P type anode 252.

In alternative implementations, one or more precursor metals (not shown in FIG. 8) can be situated over group III-V P type anode 252, and contact hole 262 can extend through a portion of blanket dielectric layer 260 to the precursor metals. Precursor metals can comprise, for example, titanium (Ti), titanium nitride (TiN), tantalum (Ta), nickel (Ni), or other suitable metals. For example, titanium (Ti), tantalum (Ta), and titanium nitride (TiN) precursor metals can be sequentially situated over group III-V P type anode 252. In various implementations, precursor metals have a thickness of approximately two hundred angstroms (200 Å) or greater or less.

Figure 9:
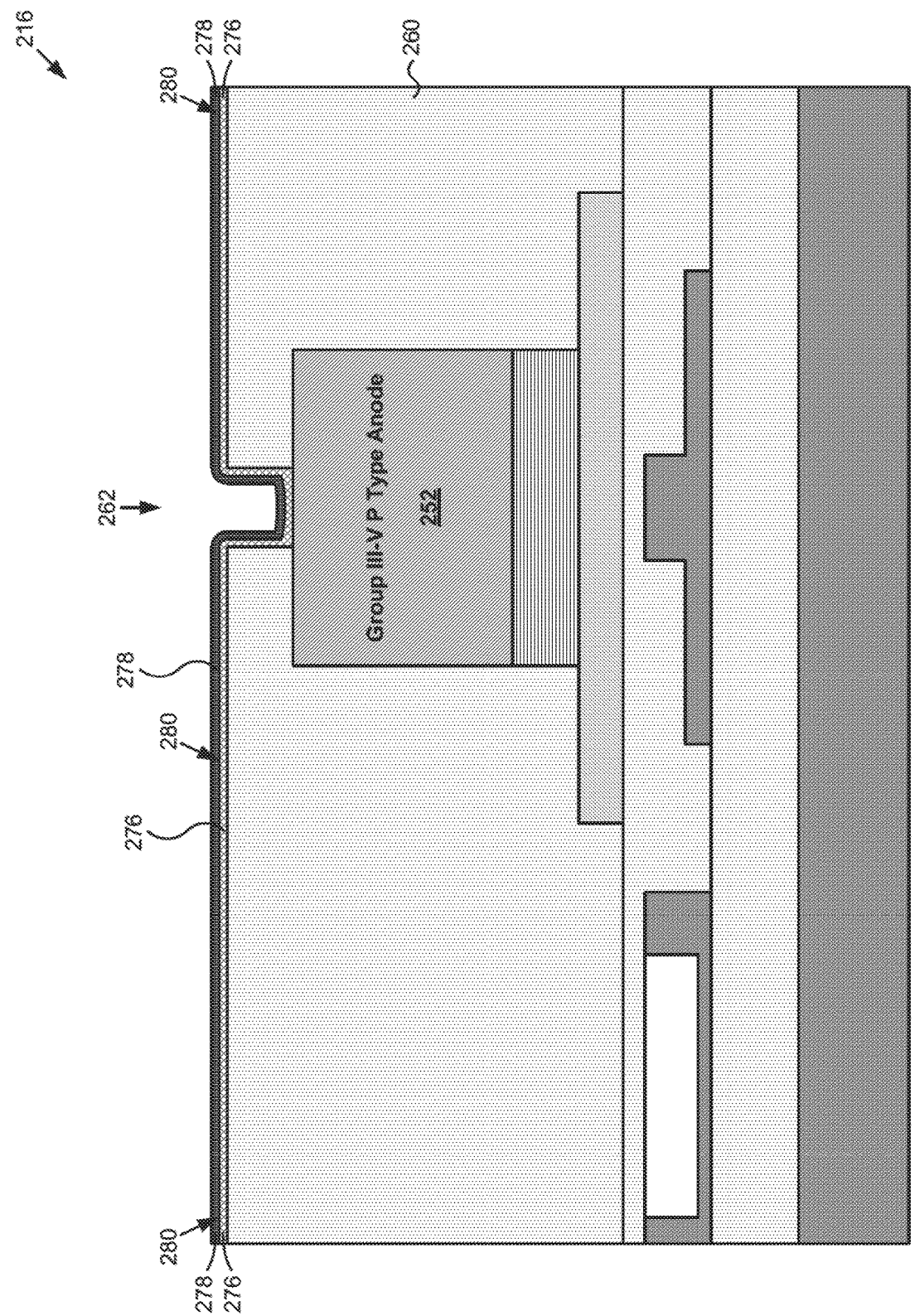
FIG. 9 illustrates a cross-sectional view of a portion of a semiconductor structure processed in accordance with the flowchart of FIG. 1B according to one implementation of the present application.

FIG. 9 illustrates a cross-sectional view of a portion of a semiconductor structure processed in accordance with action 116 in the flowchart of FIG. 1B according to one implementation of the present application. As shown in FIG. 9, in semiconductor structure 216, liner stack 280 is formed in contact hole 262 and over blanket dielectric layer 260.

Liner stack 280 lines contact hole 262 without completely filling contact hole 262. Liner stack 280 includes metal liners 276 and 278. At the bottom of contact hole 262, metal liner 276 is situated over group III-V P type anode 252. Along the sidewalls of contact hole 262, metal liner 276 is situated against blanket dielectric layer 260. Metal liner 276 is also situated over blanket dielectric layer 260.

In the present implementation, metal liner 276 is a titanium (Ti) metal liner. In other implementations, metal liner 276 can comprise titanium nitride (TiN), tantalum (Ta), nickel (Ni), or other suitable metals. Metal liner 276 may be formed by physical vapor deposition (PVD), chemical vapor deposition (CVD), or any other suitable process. In various implementations, metal liner 276 has a thickness of approximately two hundred angstroms (200 Å) or greater or less.

In alternative implementations, at the bottom of contact hole 262, metal liner 276 can be situated over one or more precursor metals (not shown in FIG. 9). A top precursor metal (not shown in FIG. 9) can comprise at least one shared component material with the bottom metal liner 276 of liner stack 280 in order to reduce nonconformities between liner stack 280 and precursor metals situated over group III-V P type anode 252. For example, the top precursor metal (not shown in FIG. 9) can comprise TiN, while the bottom metal liner 276 of liner stack 280 can comprise Ti.

Within contact hole 262, metal liner 278 is situated over metal liner 276. In the present implementation, metal liner 278 is a TiN metal liner. In other implementations, metal liner 278 can comprise Ti, Ta, Ni, or other suitable metals. Metal liner 278 may be formed by PVD, CVD, or any other suitable process. For example, metal liner 278 can be formed by PVD by reactive sputtering a Ti target with argon (Ar) and nitrogen ($N_2$). In various implementations, metal liner 278 has a thickness of approximately two hundred angstroms (200 Å) or greater or less. In various implementations, liner stack 280 can include more or fewer metal liners than shown in FIG. 9.

Figure 10:
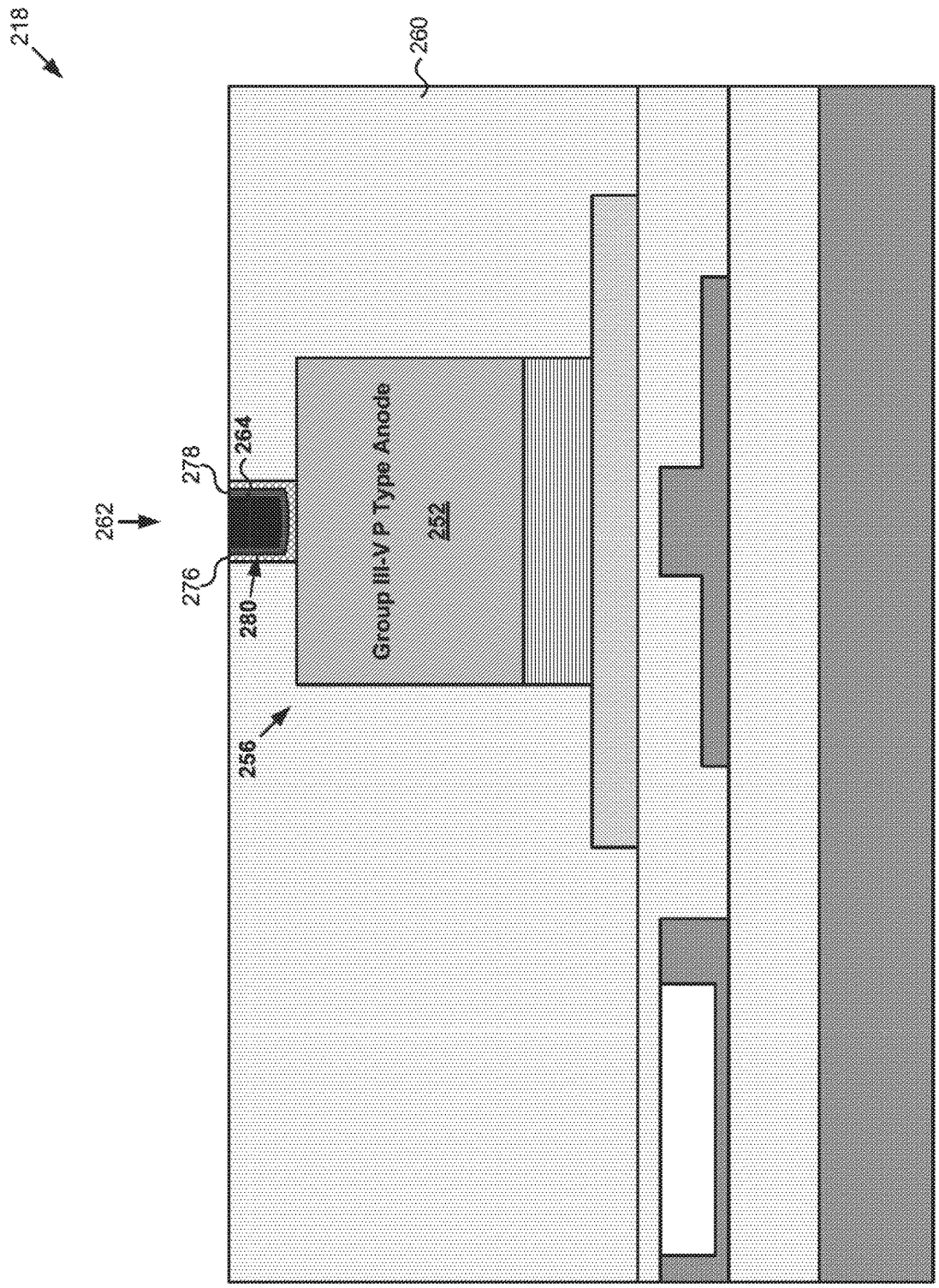
FIG. 10 illustrates a cross-sectional view of a portion of a semiconductor structure processed in accordance with the flowchart of FIG. 1B according to one implementation of the present application.

FIG. 10 illustrates a cross-sectional view of a portion of a semiconductor structure processed in accordance with action 118 in the flowchart of FIG. 1B according to one implementation of the present application. As shown in FIG. 10, in semiconductor structure 218, filler metal 264 is deposited in contact hole 262 over liner stack 280.

Filler metal 264 completely fills contact hole 262. Filler metal 264 is situated over metal liner 278 of liner stack 280. Liner stack 280 includes metal liner 276 and metal liner 278. In one implementation, filler metal 264 is deposited in contact hole 262 and over liner metal 278, and then filler metal 264 and liner stack 280 are planarized with blanket dielectric layer 260, for example, using CMP. In an alternative implementation, a damascene process is used to form filler metal 264. In various implementations, filler metal 264 can comprise tungsten (W), aluminum (Al), or copper (Cu). Liner stack 280 and filler metal 264 together function as a contact for group III-V P type anode 252 of patterned group III-V photodiode 256.

FIG. 11 illustrates a cross-sectional view of a portion of a semiconductor structure processed in accordance with action 120 in the flowchart of FIG. 1C according to one implementation of the present application. As shown in FIG. 11, in semiconductor structure 220, contact holes 263a, 263b, and 263c are formed in blanket dielectric layer 260 over group III-V N type cathode 248 of patterned group III-V photodiode 256 and over group IV device 240.

Contact holes 263a and 263b are formed over group IV device 240. Contact holes 263a and 263b extend through blanket dielectric layer 260, and through a portion of oxide layer 244, to group IV device 240. Where group IV device 240 is, for example, a transistor, contact holes 263a and 263b can be situated over a drain/source and a gate of group IV device 240. Where group IV device 240 is, for example, an operational amplifier, contact holes 263a and 263b can be situated over an input terminal and an output terminal of group IV device 240. Contact hole 263c is formed over group III-V N type cathode 248. Contact hole 263c extends through a portion of blanket dielectric layer 260 to group III-V N type cathode 248.

Contact holes 263a, 263b, and 263c can be formed, for example, using a fluorine-based plasma dry etch. In various implementations, etch stop layers (not shown in FIG. 11) can be situated over group IV device 240 and/or over group III-V N type cathode 248, and forming contact holes 263a, 263b, and 263c can comprise two different etching actions. For example, when group IV substrate 230 is provided (as shown in FIG. 2B), a nitride etch stop layer may be situated over group IV device 240. As another example, after forming patterned group III-V photodiode 256 (as shown in FIG. 5), a nitride etch stop layer can be deposited and patterned over patterned group III-V photodiode 256.

Referring back to FIG. 11, a first etching action can be performed, for example, using a fluorine-based plasma dry etch, to selectively etch blanket dielectric layer 260 and oxide layer 244 down to the etch stop layers (not shown in FIG. 11) situated over group IV device 240 and/or over group III-V N type cathode 248. Blanket dielectric layer 260 and oxide layer 244 can be aggressively etched during this first etching action without etching group IV device 240 and/or group III-V N type cathode 248. Then a second etching action can be performed, for example, using a chlorine-based plasma dry etch, in order to remove the etch stop layers (not shown in FIG. 11). This second etching action can be a short etching action that can be accurately timed to stop at the top surfaces of group IV device 240 and group III-V N type cathode 248, with minimal or substantially no etching of group IV device 240 and group III-V N type cathode 248.

In alternative implementations, one or more precursor metals (not shown in FIG. 11) can be situated over group III-V N type cathode 248, and contact hole 263c can extend through a portion of blanket dielectric layer 260 to the precursor metals. For example, nickel (Ni), nickel tantalum (NiTa), and tantalum nitride (TaN) precursor metals can be sequentially situated over group III-V N type cathode 248.

Precursor metals situated over group III-V N type cathode 248 can include at least one different precursor metal from those situated over group III-V P type anode 252. In one example, the elemental compositions of bottom precursor metals can be based on the material, dopant type, and/or dopant strength of group III-V P type anode 252 and group III-V N type cathode 248 respectively. In yet another example, the elemental compositions of top precursor metals can be chosen to have a shared material with respective metal liners formed in subsequent actions. In another example, precursor metals situated over group III-V N type cathode 248 can include the same precursor metals as those situated over group III-V P type anode 252, albeit having a different ordering/layering.

FIG. 12 illustrates a cross-sectional view of a portion of a semiconductor structure processed in accordance with action 122 in the flowchart of FIG. 1C according to one implementation of the present application. As shown in FIG. 12, in semiconductor structure 222, liner stack 281 is formed in contact holes 263a, 263b, and 263c and over blanket dielectric layer 260.

Liner stack 281 lines contact holes 263a, 263b, and 263c without completely filling contact holes 263a, 263b, and 263c. Liner stack 281 includes metal liners 277 and 279. At the bottoms of contact holes 263a and 263b, metal liner 277 is situated over group IV device 240. Along the sidewalls of contact holes 263a and 263b, metal liner 277 is situated against oxide layer 244 and blanket dielectric layer 260. At the bottom of contact hole 263c, metal liner 277 is situated over group III-V N type cathode 248. Along the sidewalls of contact hole 263c, metal liner 277 is situated against blanket dielectric layer 260. Metal liner 277 is also situated over blanket dielectric layer 260, liner stack 280, and filler metal 264. Metal liner 277 may be formed by PVD, CVD, or any other suitable process. Metal liner 277 can comprise Ti, TiN, Ta, Ni, or other suitable metals. In various implementations, metal liner 277 has a thickness of approximately two hundred angstroms (200 Å) or greater or less.

Within contact holes 263a, 263b, and 263c, metal liner 279 is situated over metal liner 277. Metal liner 279 may be formed by PVD, CVD, or any other suitable process. Metal liner 279 can comprise Ti, TiN, Ta, Ni, or other suitable metals. In various implementations, metal liner 279 has a thickness of approximately two hundred angstroms (200 Å) or greater or less.

In alternative implementations, at the bottom of contact hole 263c, metal liner 277 can be situated over one or more precursor metals (not shown in FIG. 12). A top precursor metal (not shown in FIG. 12) can comprise at least one shared component material with the bottom metal liner 277 of liner stack 281 in order to reduce nonconformities between liner stack 281 and precursor metals situated over group III-V N type cathode 248.

Liner stack 281 includes at least one different metal liner from liner stack 280. For example, the bottom metal liner 277 of liner stack 281 can comprise Ni, while the bottom metal liner 276 (shown in FIG. 9) of liner stack 280 can comprise Ti. Accordingly, liner stacks 280 and 281 may also be referred to as first liner stack 280 and second liner stack 281, respectively, in the present application. It is noted that liner stacks 280 and 281 can be different in terms of elemental composition of liner metals or in terms of ordering/layering of liner metals within the stacks, as described above. In various implementations, liner stack 281 can include more or fewer metal liners than shown in FIG. 12.

Figure 13:
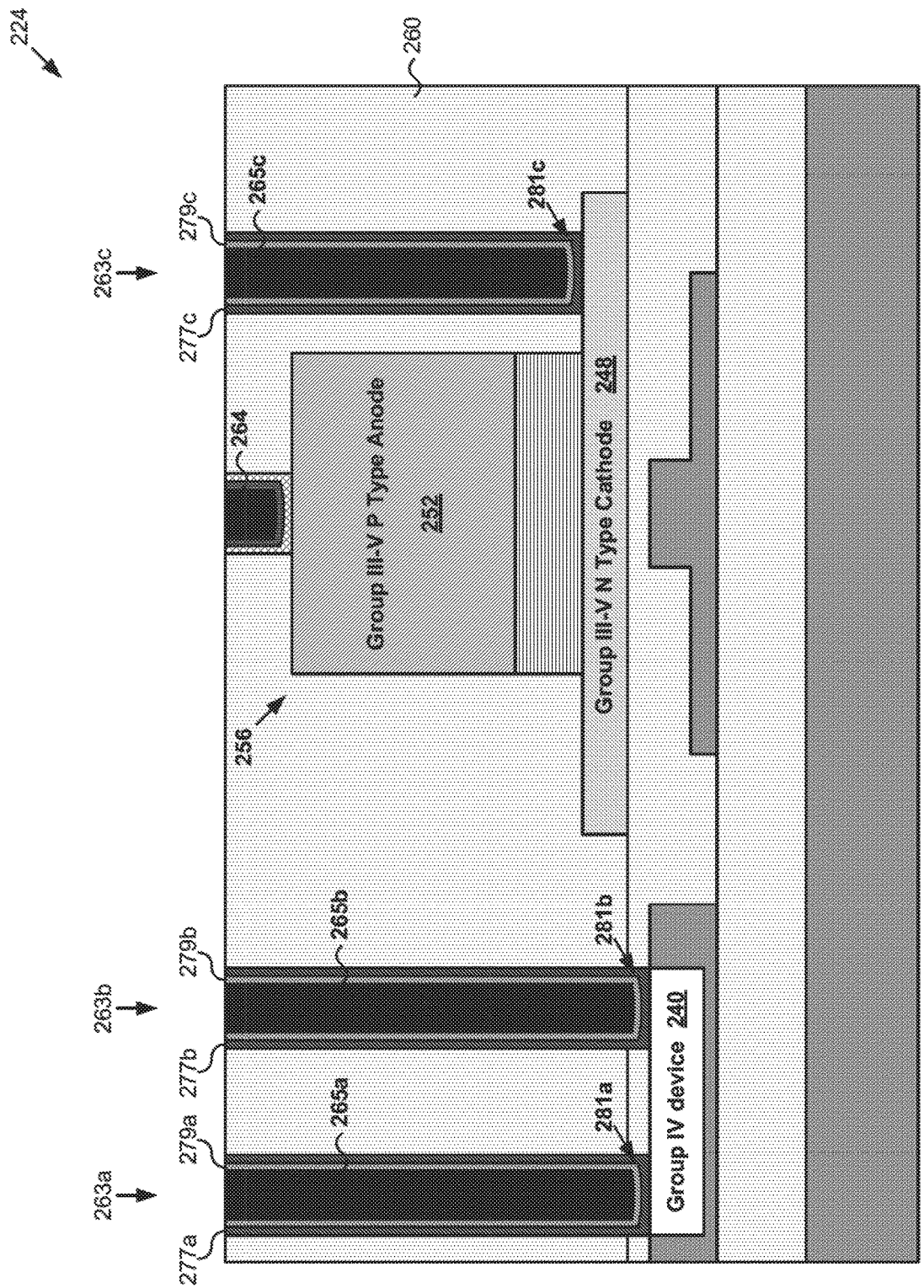
FIG. 13 illustrates a cross-sectional view of a portion of a semiconductor structure processed in accordance with the flowchart of FIG. 1C according to one implementation of the present application.

FIG. 13 illustrates a cross-sectional view of a portion of a semiconductor structure processed in accordance with action 124 in the flowchart of FIG. 1C according to one implementation of the present application. As shown in FIG. 13, in semiconductor structure 224, filler metals 265a, 265b, and 265c are deposited in contact holes 263a, 263b, and 263c over liner stacks 281a, 281b, and 281c respectively.

Filler metals 265a, 265b, and 265c completely fill contact holes 263a, 263b, and 263c. Filler metals 265a, 265b, and 265c are situated over metal liners 279a, 279b, and 279c of liner stacks 281a, 281b, and 281c. Each of liner stacks 281a, 281b, and 281c includes a respective one of metal liners 277a, 277b, and 277c, and a respective one of metal liners 279a, 279b, and 279c. In one implementation, a filler metal is deposited in contact holes 263a, 263b, and 263c and over liner metal 279 (shown in FIG. 12), and then the filler metal and liner stack 281 (shown in FIG. 12) are planarized with blanket dielectric layer 260, for example, using CMP, thereby forming filler metals 265a, 265b, and 265c and inner stacks 281a, 281b, and 281c. In an alternative implementation, a damascene process is used to form filler metals 265a, 265b, and 265c and liner stacks 281a, 281b, and 281c. In various implementations, filler metals 265a, 265b, and 265c can comprise tungsten (W), aluminum (Al), or copper (Cu). In one implementation, filler metals 265a, 265b, and 265c can be different from filler metal 264.

Liner stack 281a and filler metal 265a together function as a contact for group IV device 240. Liner stack 281b and filler metal 265b together function as another contact for group IV device 240. Liner stack 281c and filler metal 265c together function as a contact for group III-V N type cathode 248 of patterned group III-V photodiode 256.

Although the present method illustrates the contact for group III-V N type cathode 248 formed after the contact for group III-V P type anode 252, in other implementations, the contact for group III-V N type cathode 248 may be formed first. Although contacts for group IV device 240 are formed substantially concurrently with the contact for group III-V N type cathode 248 in FIG. 13, in other implementations, contacts for group IV device 240 can be formed separately from the contact for group III-V N type cathode 248. For example, in one implementation, contacts for group IV device 240 are not formed until after the contact for group III-V N type cathode 248. In this implementation, liner stacks 281a and 281b may be omitted from contact holes 263a and 263b, or liner stacks 281a and 281b in contact holes 263a and 263b may have different composition than liner stack 281c in contact holes 263c. As another example, in one implementation, contacts for group IV device 240 are formed substantially concurrently with the contact for group III-V P type anode 252. In this implementation, additional etch protection can be utilized for group III-V P type anode 252 compared to group IV device 240. For example, thicker and/or additional etch stop layers may be situated over group III-V P type anode 252.

Figure 14:
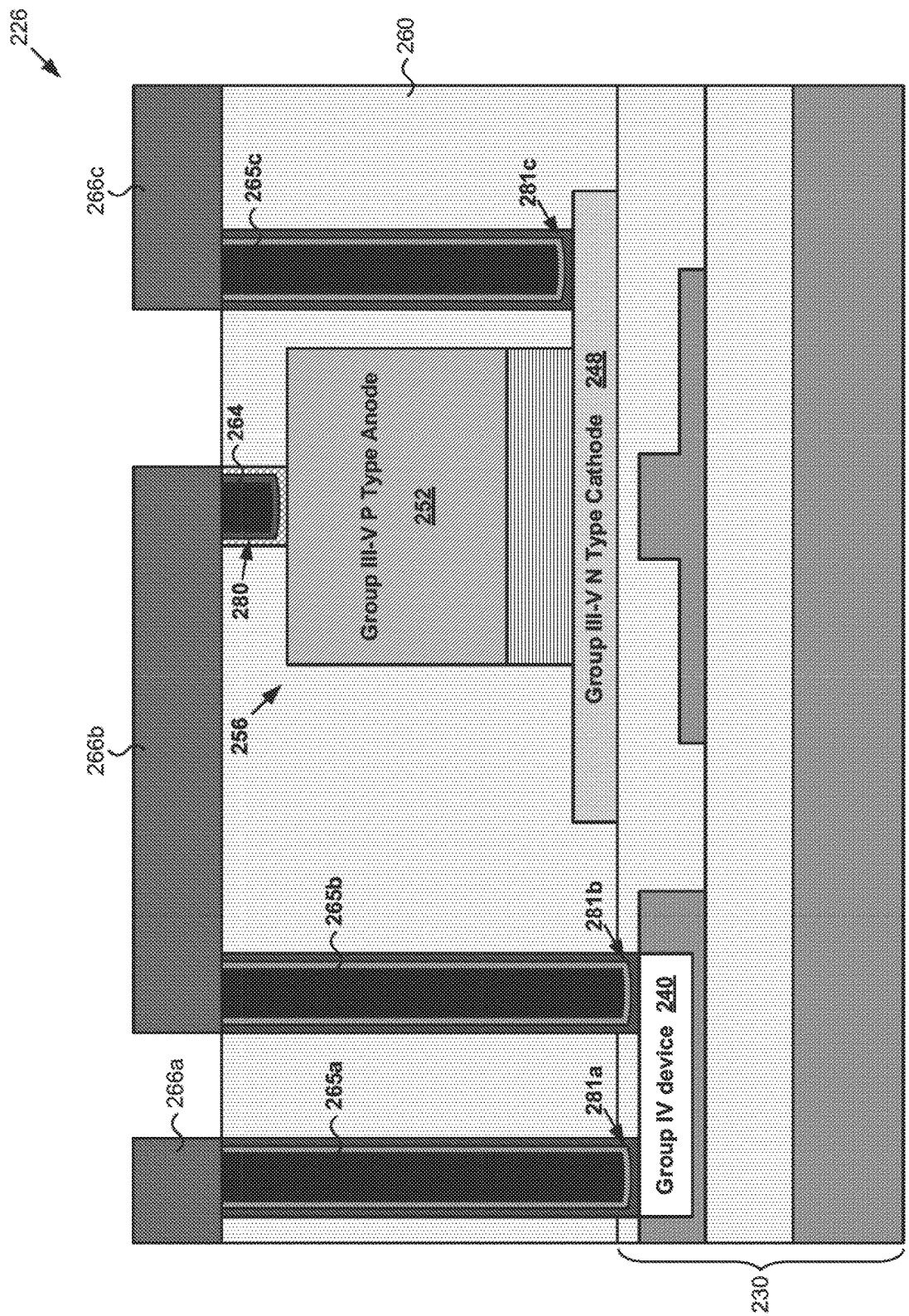
FIG. 14 illustrates a cross-sectional view of a portion of a semiconductor structure processed in accordance with the flowchart of FIG. 1C according to one implementation of the present application.

FIG. 14 illustrates a cross-sectional view of a portion of a semiconductor structure processed in accordance with action 126 in the flowchart of FIG. 1C according to one implementation of the present application. As shown in FIG. 14, in semiconductor structure 226, interconnect metals 266a, 266b, and 266c are formed over blanket dielectric layer 260, over liner stacks 280, 281a, 281b, and 281c, and over filler metals 264, 265a, 265b, and 265c.

Interconnect metal 266a is situated over blanket dielectric layer 260, liner stack 281a, and filler metal 265a. Interconnect metal 266b is situated over blanket dielectric layer 260, liner stacks 280 and 281b, and filler metals 264 and 265b. In particular, a first end of interconnect metal 266b is situated over liner stack 281b and filler metal 265b, and a second end of interconnect metal 266b is situated over liner stack 280 and filler metal 264. Interconnect metal 266c is situated over blanket dielectric layer 260, liner stack 281c, and filler metal 265c.

In one implementation, a metal layer is deposited over blanket dielectric layer 260, liner stacks 280, 281a, 281b, and 281c, and filler metals 264, 265a, 265b, and 265c, and then segments thereof are etched, thereby forming interconnect metals 266a, 266b, and 266c. In an alternative implementation, a damascene process is used to form interconnect metals 266a, 266b, and 266c. In various implementations, interconnect metals 266a, 266b, and 266c can comprise W, Al, or Cu. Although filler metals 265a, 265b, and 265c and interconnect metals 266a, 266b, and 266c are separate formations in FIG. 14, in other implementations they may be parts of the same formation, for example, using a dual damascene process.

In semiconductor structure 226, liner stacks 280, 281a, 281b, and 281c, filler metals 264, 265a, 265b, and 265c, and interconnect metals 266a, 266b, and 266c are electrically connected to patterned group III-V photodiode 256 and group IV device 240. In particular, liner stack 280, filler metal 264, interconnect metal 266b, filler metal 265b, and liner stack 281b create a direct path electrically connecting group III-V P type anode 252 of patterned group III-V photodiode 256 over group IV substrate 230 to group IV device 240 in group IV substrate 230. In one implementation, group IV device 240 can be part of a readout circuit for patterned group III-V photodiode 256. In another implementation, where patterned group III-V photodiode 256 is another type of patterned group III-V device, such as a patterned group III-V laser, group IV device 240 can be part of a driver circuit for the patterned group III-V laser. Interconnect metal 266a can electrically connect group IV device 240 to other structures (not shown in FIG. 14). Similarly, interconnect metal 266c can electrically connect group III-V N type cathode 248 of patterned group III-V photodiode 256 to other structures (not shown in FIG. 14). As described below, interconnect metals 266a, 266b, and 266c facilitate additional connections to higher metallization levels.

Figure 15:
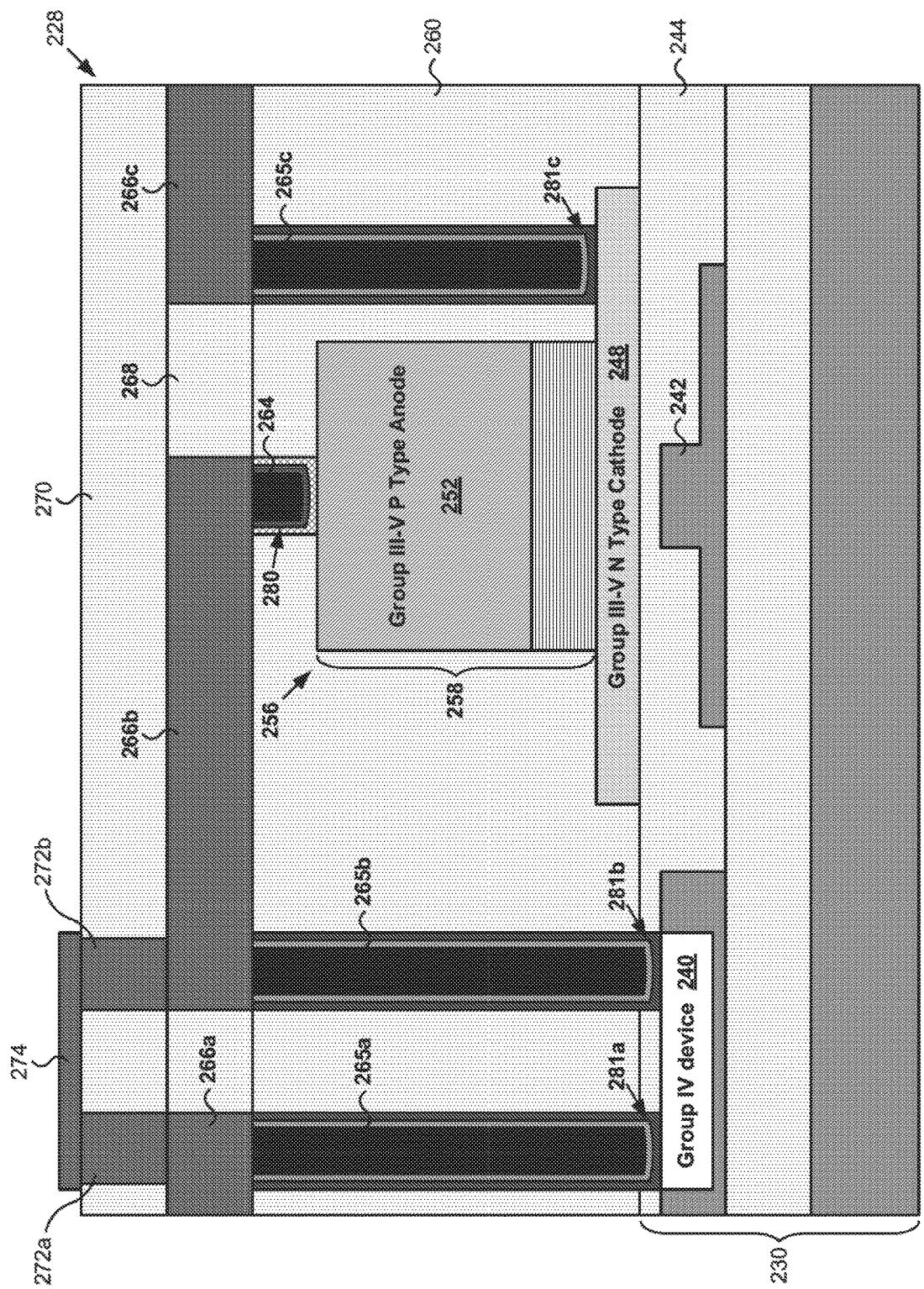
FIG. 15 illustrates a cross-sectional view of a portion of a semiconductor structure processed in accordance with the flowchart of FIG. 1C according to one implementation of the present application.

FIG. 15 illustrates a cross-sectional view of a portion of a semiconductor structure processed in accordance with action 128 in the flowchart of FIG. 1C according to one implementation of the present application. As shown in FIG. 15, in semiconductor structure 228, metal resistor 274 (that is used merely as one example of an integrated passive device (IPD) in the present application) is formed over blanket dielectric layer 260 and electrically connected to patterned group III-V photodiode 256. Semiconductor structure 228 also includes metallization level 268, interlayer dielectric 270, vias 272a and 272b, and metal resistor 274.

Metallization level 268 is, for example, a first metallization level and interconnect metals 266a, 266b, and 266c are situated in metallization level 268. Semiconductor structure 228 can include additional metallization levels (not shown in FIG. 15). For example, a second metallization level can be situated over interlayer dielectric 270, and metal resistor 274 can be situated in that metallization level. Metallization levels, such as metallization level 268, provide layers in which passive devices, such as metal resistor 274, and interconnect metals, such as interconnect metals 266a, 266b, and 266c, can be built as part of a back-end-of-line (BEOL) multi-level metallization (MLM). Metallization levels, such as metallization level 268, can comprise $SiO_2$, $Si_xN_y$, or another dielectric between interconnect metal and/or passive devices.

Interlayer dielectric 270 is situated over metallization level 268. Interlayer dielectric 270 provides insulation between metallization level 268 and metallization levels formed above it. Interlayer dielectric 270 also provides a layer in which vias, such as vias 272a and 272b, can be built. In various implementations, interlayer dielectric 270 can comprise $SiO_2$, $Si_xN_y$, or another dielectric. Semiconductor structure 228 can include additional interlayer dielectrics (not shown in FIG. 15).

Via 272a connects interconnect metal 266a to a first end of metal resistor 274. Via 272b connects interconnect metal 266b to a second end of metal resistor 274. Metal resistor 274 is an integrated passive device (IPD) and, in the present example, is disposed on interlayer dielectric 270. The first end of metal resistor 274 is electrically connected to a first terminal of group IV device 240 by via 272a, interconnect metal 266a, filler metal 265a, and liner stack 281a. The second end of metal resistor 274 is electrically connected to a second terminal of group IV device 240 by via 272b, interconnect metal 266b, filler metal 265b, and liner stack 281b. The second end of metal resistor 274 is also electrically connected to group III-V P type anode 252 of patterned group III-V photodiode 256 by via 272b, interconnect metal 266b, filler metal 264, and liner stack 280. Where group IV device 240 is, for example, an operational amplifier, metal resistor 274 can be, for example, a feedback resistor, and metal resistor 274 and group IV device 240 can be part of a transimpedance amplifier for readout of patterned group III-V photodiode 256. In various implementations, metal resistor 274 can comprise titanium nitride (TiN), tantalum nitride (TaN), or nickel chromium (NiCr).

In various implementations, metal resistor 274 can be disposed in any level over blanket dielectric layer 260. In various implementations, metal resistor 274 can be connected to any other structure or device in semiconductor structure 228. In various implementations, semiconductor structure 228 can include other IPDs, such as capacitors and/or inductors, instead of or in addition to metal resistor 274. These IPDs can be, for example, part of a feedback, filtering, or biasing circuit, and can be electrically connected to terminals of patterned group III-V photodiode 256 and/or group IV device 240 in a different manner than shown in FIG. 15.

Semiconductor structures according to the present invention, such as semiconductor structure 228 in FIG. 15, result in several advantages. First, patterned group III-V photodiode 256 is integrated in the same semiconductor structure as group IV device 242 that it is optically connected to. Especially where a portion of oxide layer 244 above group IV device 242 is kept thin, patterned group III-V photodiode 256 is in close proximity to group IV device 242, and optical losses are reduced.

Second, since patterned group III-V photodiode 256 is patterned after group III-V chiplet 246 (shown in FIG. 4) is bonded to group IV substrate 230, alignment is improved. Photolithography techniques utilized to form group IV device 242 can also be utilized to form patterned group III-V photodiode 256, such that patterned group III-V photodiode 256 is aligned to group IV device 242. If a group III-V device were patterned prior to bonding to group IV substrate 230, inaccurate mechanical alignment of the group III-V device during the bonding could cause significant optical losses between the group III-V device and group IV device 242.

Third, because blanket dielectric layer 260 is substantially planar, semiconductor structure 228 is compatible with modern group IV BEOL MLM schemes. Conventional techniques for forming contacts for a group III-V device employ lift-off of a gold (Au) metal layer. These lift-off techniques are generally unsuitable for high aspect ratio contacts, and leave residual materials that are difficult to clean. Gold also acts as a dopant to silicon and can have unintended consequences when integrating with group IV substrate 230. Moreover, these lift-off techniques result in contacts for group III-V P type anode 252 and group III-V N type cathode 248 being non-planar, one residing significantly higher than the other due to the height of group III-V mesa 258. Forming subsequent metallization levels and interlayer dielectrics over these non-planar contacts could result in extreme topographies and contours, making lithographic alignment difficult, and significantly increasing the complexity when connecting the contacts to overlying interconnect metals and vias.

In semiconductor structure 228 in FIG. 15, filler metals 264 and 265c connected to patterned group III-V photodiode 256 are situated within and are substantially planar with blanket dielectric layer 260. Accordingly, metallization level 268 and interlayer dielectric 270 do not have extreme topographies, and interconnect metals 266a, 266b, and 266c and vias 272a and 272b are easily connected to filler metals 264 and 265c.

Fourth, because patterned group III-V photodiode 256 and group IV device 240 are integrated at the wafer-level and compatible with BEOL MLM schemes, semiconductor structure 228 exhibits increased connectivity and improved performance. Patterned group III-V photodiode 256 is not separately packaged and does not need to be connected to group IV device 240, for example, using wirebonds or solder balls, which generally increase electrical losses. Rather, in semiconductor structure 228, liner stack 280, filler metal 264, interconnect metal 266b, filler metal 265b, and liner stack 281b create a direct path electrically connecting patterned group III-V photodiode 256 over group IV substrate 230 to group IV device 240 in group IV substrate 230. Patterned group III-V photodiode 256 also generally experiences low losses when electrically connected to other group IV devices in group IV substrate 230, and when electrically connected to IPDs, such as metal resistor 274, over blanket dielectric layer 260.

Fifth, liner stacks 280 and 281c result in patterned group III-V photodiode 256 having low contact resistance. Metal liners used in liner stacks 280 and 281c, such as Ti, TiN, Ta, and Ni metal liners, generally create better contact with group III-V materials than filler metals 264 and 265c. Moreover, because liner stack 281c includes at least one different metal liner from liner stack 280, liner stacks 280 and 281c can be tailored to create better contact based on the material, dopant type, and/or dopant strength of group III-V P type anode 252 and group III-V N type cathode 248. For example, where group III-V P type anode 252 comprises heavily doped P type InGaAs, the bottom metal liner 276 (shown in FIG. 10) of liner stack 280 can comprise Ti, which creates good contact with heavily doped P type InGaAs. Meanwhile, where group III-V N type cathode 248 comprises N type InP, the bottom metal liner 277c (shown in FIG. 13) of liner stack 281c can comprise Ni, which creates good contact with N type InP.

Liner stacks 280 and 281c function as adhesive layers for filler metals 264 and 265c, preventing delamination of filler metals 264 and 265c and/or other nonconformities in filler metals 264 and 265c. Liner stacks 280 and 281c can prevent formation of high resistivity oxides, such as tungsten oxide ($WO_2$ or $WO_3$) and aluminum oxide ($Al_2O_3$), around filler metals 264 and 265c. Liner stacks 280 and 281c also function as barrier layers to prevent metal diffusion of filler metals 264 and 265c. These various functions of liner stacks 280 and 281c all contribute to low contact resistance at group III-V P type anode 252 and group III-V N type cathode 248 of patterned group III-V photodiode 256. Because the reliability and performance of optoelectronic devices, such as patterned group III-V photodiode 256, can depend on having low contact resistance, liner stacks 280 and 281c are particularly effective in semiconductor structure 228.

Sixth, fabrication of liner stacks 280 and 281c is relatively uncomplicated. Liner stacks 280 and 281c are formed prior to the first metal of BEOL MLM schemes, for example, prior to a filler metal and/or a first metallization level, in a manner that does not disrupt subsequent planar processing. Liner stacks 280 and 281c can also be used in conjunction with etch stop layers and precursor metals, as described above, to reduce nonconformities between liner stack 280 and group III-V P type anode 252, and between liner stack 281c and group III-V N type cathode 248.

From the above description it is manifest that various techniques can be used for implementing the concepts described in the present application without departing from the scope of those concepts. Moreover, while the concepts have been described with reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A method comprising:
providing a group IV substrate and a group III-V chiplet;
bonding said group III-V chiplet to said group IV substrate;
patterning said group III-V chiplet to produce a patterned group III-V device;
forming a blanket dielectric layer over said patterned group III-V device;
forming a first contact hole in said blanket dielectric layer over a first portion of said patterned group III-V device;
forming a first liner stack in said first contact hole;
depositing a first filler metal in said first contact hole over said first liner stack;
forming a second contact hole in said blanket dielectric layer over a second portion of said patterned group III-V device;
forming a second liner stack in said second contact hole, wherein said second liner stack comprises at least one different metal liner from said first liner stack;
depositing a second filler metal in said first contact hole over said second liner stack.

2. The method of claim 1, wherein said first portion of said patterned group III-V device is a P type layer, and said second portion of said patterned group III-V device is an N type layer.

3. The method of claim 2, wherein:
said forming said first liner stack comprises forming a first bottom metal liner comprising titanium (Ti);
said forming said second liner stack comprises forming a second bottom metal liner comprising nickel (Ni).

4. The method of claim 1, wherein:
said patterned group III-V device is a patterned group III-V photodiode;
said first portion is a P type anode of said patterned group III-V photodiode, wherein said P type anode comprises indium gallium arsenide (InGaAs);
said second portion is an N type cathode of said patterned group III-V photodiode, wherein said N type cathode comprises indium phosphide (InP).

5. The method of claim 1, further comprising planarizing said blanket dielectric layer prior to said forming said first contact hole.

6. The method of claim 1, further comprising planarizing said first liner stack with said blanket dielectric layer prior to said forming said second contact hole.

7. The method of claim 1, wherein said forming said first liner stack comprises forming a first bottom metal liner selected from the group consisting of titanium (Ti), titanium nitride (TiN), tantalum (Ta), and nickel (Ni).

8. The method of claim 7, wherein said forming said second liner stack comprises forming a second bottom metal liner that is different from said first bottom metal liner, said second bottom metal liner selected from the group consisting of titanium (Ti), titanium nitride (TiN), tantalum (Ta), and nickel (Ni).

9. The method of claim 1, wherein said first and second filler metals are selected from the group consisting of tungsten (W), aluminum (Al), and copper (Cu).

10. The method of claim 1, further comprising electrically connecting said patterned group III-V device to a group IV device.

11. A semiconductor structure comprising:
a group IV substrate;
a patterned group III-V device over said group IV substrate;
a blanket dielectric layer over said patterned group III-V device;
a first contact hole in said blanket dielectric layer over a first portion of said patterned group III-V device;
a first liner stack in said first contact hole;
a first filler metal in said first contact hole over said first liner stack;
a second contact hole in said blanket dielectric layer over a second portion of said patterned group III-V device;
a second liner stack in said second contact hole, wherein said second liner stack comprises at least one different metal liner from said first liner stack;
a second filler metal in said second contact hole over said second liner stack.

12. The semiconductor structure of claim 11, wherein said first portion of said patterned group III-V device is a P type layer, and said second portion of said patterned group III-V device is an N type layer.

13. The semiconductor structure of claim 12, wherein:
a first bottom metal liner of said first liner stack comprises titanium (Ti);
a second bottom metal liner of said second liner stack comprises nickel (Ni).

14. The semiconductor structure of claim 11, wherein:
said patterned group III-V device is a patterned group III-V photodiode;
said first portion is a P type anode of said patterned group III-V photodiode, wherein said P type anode comprises indium gallium arsenide (InGaAs);
said second portion is an N type cathode of said patterned group III-V photodiode, wherein said N type cathode comprises indium phosphide (InP).

15. The semiconductor structure of claim 11, wherein said blanket dielectric layer is substantially planar.

16. The semiconductor structure of claim 15, wherein said first filler metal and said first liner stack are substantially planar with said blanket dielectric layer.

17. The semiconductor structure of claim 11, wherein said first liner stack comprises a first bottom metal liner selected from the group consisting of titanium (Ti), titanium nitride (TiN), tantalum (Ta), and nickel (Ni).

18. The semiconductor structure of claim 17, wherein said second liner stack comprises a second bottom metal liner that is different from said first bottom metal liner, said second bottom metal liner selected from the group consisting of titanium (Ti), titanium nitride (TiN), tantalum (Ta), and nickel (Ni).

19. The semiconductor structure of claim 11, wherein said first and second filler metals are selected from the group consisting of tungsten (W), aluminum (Al), and copper (Cu).

20. The semiconductor structure of claim 11, wherein said patterned group III-V device is optically and/or electrically connected to a group IV device.

* * * * *